United States Patent
Johannesson

(10) Patent No.: US 9,667,058 B2
(45) Date of Patent: May 30, 2017

(54) METHOD AND APPARATUS FOR SENSING A FAULT IN A POWER SYSTEM

(71) Applicant: ABB Schweiz AG, Baden (CH)

(72) Inventor: Niclas Johannesson, Ludvika (SE)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 15/120,191

(22) PCT Filed: Mar. 17, 2014

(86) PCT No.: PCT/EP2014/055276
§ 371 (c)(1),
(2) Date: Aug. 19, 2016

(87) PCT Pub. No.: WO2015/139719
PCT Pub. Date: Sep. 24, 2015

(65) Prior Publication Data
US 2017/0117701 A1    Apr. 27, 2017

(51) Int. Cl.
*H02H 7/26*    (2006.01)
*H02H 3/30*    (2006.01)

(52) U.S. Cl.
CPC ............ *H02H 7/265* (2013.01); *H02H 3/305* (2013.01)

(58) Field of Classification Search
CPC ................................ H02H 3/305; H02H 7/265
USPC ........................................................ 361/87
See application file for complete search history.

(56) References Cited

U.S. PATENT DOCUMENTS

| 3,590,368 A | 6/1971 | Esclangon |
| 4,438,475 A | 3/1984 | Haley |
| 2007/0059986 A1 | 3/2007 | Rockwell |

FOREIGN PATENT DOCUMENTS

| CN | 102694374 B | 7/2014 |
| WO | WO 2013/185522 A1 | 12/2013 |

*Primary Examiner* — Thienvu Tran
*Assistant Examiner* — Kevin J Comber
(74) *Attorney, Agent, or Firm* — Birch, Stewart, Kolasch & Birch, LLP

(57) ABSTRACT

A method in a power system which includes a protected unit, such as a transmission line, adapted to convey power from a first position in the protected unit to a second position in the protected unit, or vice versa, via a plurality of conductors. A first travelling wave differential current (ITWdiff) is determined based on a comparison between a determined first travelling wave current or a second travelling wave current in first and second positions and an estimation of the first travelling wave current or the second travelling wave current, respectively. The estimation is carried out using a propagation function which takes into account any distortion, attenuation and/or delay of the waveform of a wave due to propagation of the wave in the protected unit. A second or normalized travelling wave differential current (ITWdiff) is determined by means of, based on the propagation function, adjusting at least one of magnitude and phase of the first travelling wave differential current such that all modes attain equal or increasingly equal modal characteristics. The method may facilitate or enable mitigating or even eliminating any false differential current in elements of a travelling wave differential current vector which correspond to healthy conductors, caused by coupling effects between conductors.

21 Claims, 7 Drawing Sheets

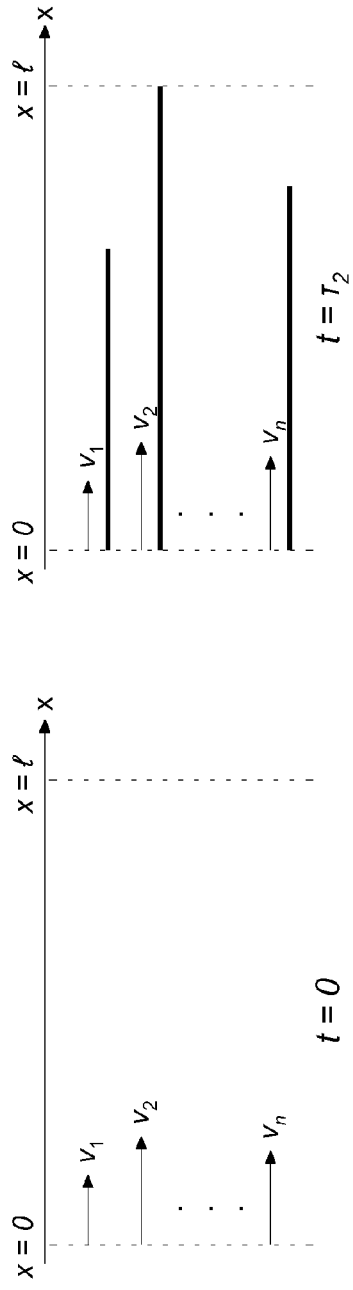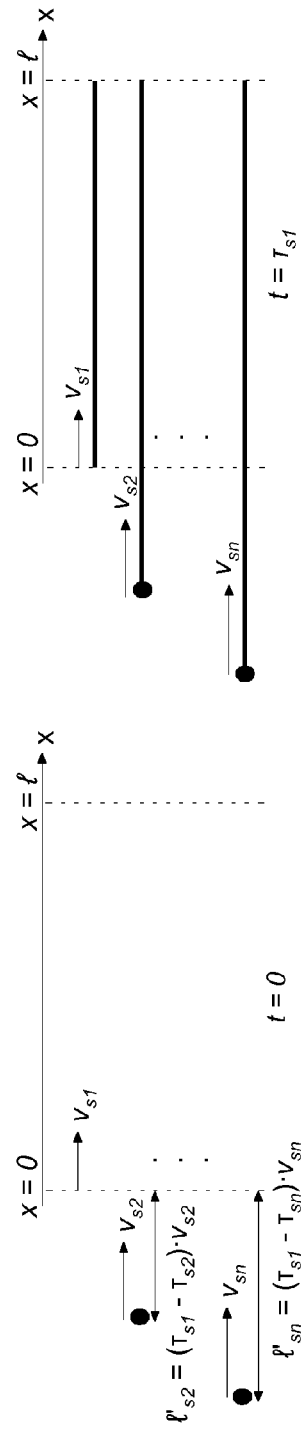

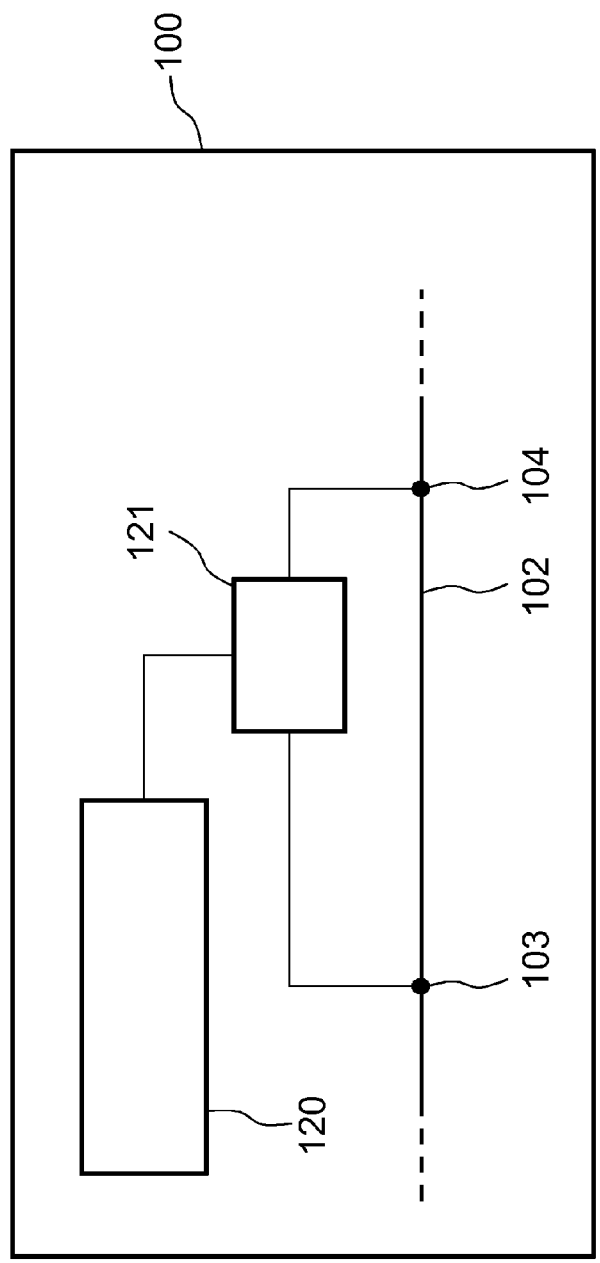
Fig. 7
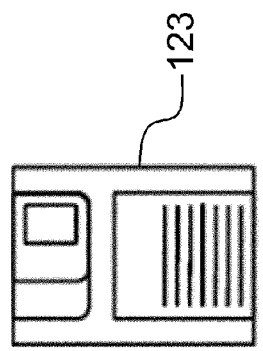
Fig. 9
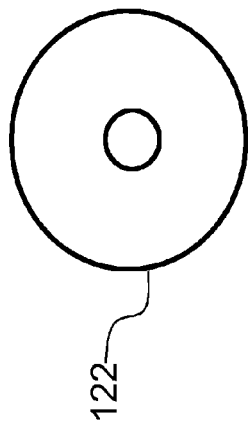

METHOD AND APPARATUS FOR SENSING A FAULT IN A POWER SYSTEM

TECHNICAL FIELD

The present invention generally relates to power systems such as electrical power distribution or transmission systems, e.g. High Voltage Direct Current (HVDC) power transmission systems. Specifically, the present invention relates to a method in a power system which may be used for sensing a fault in a protected unit included in the power system.

BACKGROUND

Power systems such as electrical power distribution or transmission systems generally include a protection system for protecting, monitoring and controlling the operation and/or functionality of other components included in the power system. Such a protection system may for example detect short-circuits, over-currents and over-voltages in power lines, transformers and/or other parts or components of the power system. The protection system can include protection equipment such as circuit breakers for isolating any possible faults for example occurring in power transmission and distribution lines by opening or tripping the circuit breakers. After the fault has been cleared, e.g. by performing repairs and/or maintenance on the component in which the fault has been detected, the power flow can be restored by closing the circuit breakers. Alternatively or optionally, the protection system can be arranged to, upon detection of a fault in a particular route for power flow, isolate the route in which the fault has been detected and select an alternative route for the power flow.

Differential protection is a method for protection of power systems that is based on comparing currents on sides of a protected zone or a protected unit. A protected unit could in principle include or be any part or component of the power system, for example a transmission line, transformer, generator, and/or a transformer station busbar. Differential protection is a widely used type of protection in power systems due to advantages such as speed, reliability, sensitivity and selectivity. The differential protection principle is based on Kirchhoff's current law, and is usually implemented by summation of all the measured currents entering and leaving the protected unit and detecting a fault if the sum deviates from zero, hence indicating that some abnormal current path exist, i.e. a fault, in the protected unit. However, since 'regular' circuit theory no longer holds when the propagation time in a circuit is not negligible, performance of the differential protection may be degraded in such cases. For example, when the differential protection is applied in protected units where the power flow or current path is relatively long, e.g. where the protected unit is a relatively long transmission line such as an overhead transmission line (OHL) or a direct current (DC) cable, fault detection reliability and/or accuracy may be degraded due to time of propagation and reflections of travelling waves in the protected unit. By a "relatively long" current path or transmission line it is generally meant a current path or transmission line that cannot be accurately represented by a 'lumped' transmission line model or lumped element model, i.e. a current path or transmission line for which the transmission line parameters or attributes such as impedance, speed of wave propagation and bandwidth of the waveform of a wave are distributed throughout the material of the current path or transmission line. This is generally the case where the current path or transmission line has a length that is relatively large compared to the wavelength or a fraction of the wavelength of the operating frequency of the current path or transmission line. In non steady state, time of propagation and reflections of travelling waves in the protected unit can cause the currents in the line ends to differ, in particular during transients caused by e.g. external faults, and thereby give rise to a detection of a fault in the protected unit even though there is no fault at the time. In turn, this can cause an increase in unwarranted trips of circuit breakers in the power system, thereby causing an unwarranted interruption in power flow.

SUMMARY

For OHL configurations, distortion of the waveform of travelling waves is generally small and may be neglected. However, for other configurations such as DC cables or OHL-DC cable mixed configurations, distortion and/or attenuation of the waveform of travelling waves is generally not negligible.

In view of the above discussion, a concern of the present invention is to provide a method in a power system, which method may facilitate or enable sensing a fault in a protected unit included in a power system, which protected unit is adapted to, under normal or non-faulted operation conditions, convey power from a first position in the protected unit to a second position, different from the first position, in the protected unit, or vice versa, via plurality of conductors, wherein on a condition that a fault occurs in the protected unit at least one travelling wave is generated in the protected unit. The method may facilitate or enable an increased fault sensing reliability and/or accuracy compared to known differential protection methods particularly in case the protected unit, e.g. a transmission line, is such that waveform distortion and/or attenuation of travelling waves in the protected unit is not negligible.

It has been found that, at least for some transmission line configurations, and at least for internal faults, coupling effects between conductors might result in a false differential current in elements of a travelling wave differential current vector which correspond to healthy conductors.

A further a concern of the present invention is to provide a method in a power system, which method may facilitate or enable sensing a fault in a protected unit included in a power system, which protected unit is adapted to, under normal or non-faulted operation conditions, convey power from a first position in the protected unit to a second position, different from the first position, in the protected unit, or vice versa, via plurality of conductors, wherein on a condition that a fault occurs in the protected unit at least one travelling wave is generated in the protected unit. The method may facilitate or enable mitigating or even eliminating any false differential current in elements of a travelling wave differential current vector which correspond to healthy conductors.

Any distortion of the waveform of a wave due to the propagation of the wave in the protected unit is generally due to the wave impedance being frequency dependent. Any attenuation of a wave due to the propagation of the wave in the protected unit is generally due to due to loss of energy, e.g. in the resistances of the protected unit conductors and earth. Any delay of a wave due to the propagation of the wave in the protected unit is generally due to the wave impedance being frequency dependent and/or the length of the power flow or current path in the protected unit.

A further a concern of the present invention is to provide a method in a power system, which method may facilitate or enable sensing a fault in a protected unit included in a power system, which protected unit is adapted to, under normal or non-faulted operation conditions, convey power from a first position in the protected unit to a second position, different from the first position, in the protected unit, or vice versa, via a plurality of conductors, wherein on a condition that a fault occurs in the protected unit at least one travelling wave is generated in the protected unit. The method may facilitate or enable reducing or even eliminating the number of unwarranted interruptions in power flow in the power system, e.g. by tripping of circuit breakers in the power system, due to false detections of faults in the protected unit.

To address at least one of these concerns and other concerns, a method and a processing module in accordance with the independent claims are provided. Preferred embodiments are defined by the dependent claims.

In the following, the protected unit will often be referred to by an example of it being constituted by or including a transmission line, which may be a multi-conductor transmission line, i.e. a transmission line comprising a plurality of conductors or phases. However, it is to be understood that the protected unit in general may be included in or be any part or component of the power system, for example a transmission line, a transformer, a generator and/or a transformer station busbar. In the following, even if reference is made to an example where the protected unit is constituted by or including a transmission line, it is to be understood that the same or similar principles apply to other examples such as mentioned above where the protected unit is not constituted by or including a transmission line. Hence, the term 'transmission line' or 'line' as used herein should be construed broadly, and is not intended to limit the scope.

Attenuation and distortion of waves due to their propagation along a current path in the protected unit or in the transmission line result in a decrease in amplitude and elongation of the waves. The attenuation is generally due to loss of energy, e.g. in the resistances of the protected unit conductors and earth. The distortion is generally due to the wave impedance being frequency dependent.

In the event of a fault occurring in a transmission line, transients that propagate along the transmission line as waves are created. Each wave may be a composite of frequencies, ranging from a few kHz to several MHz, having a fast rising front and a slower decaying tail. Composite waves may travel at a fraction or close to the speed of light in vacuum away from the fault location toward line ends. For example in DC cables, waves may travel at speeds of about one fourth to one third of the speed of light in vacuum. The waves continue to travel throughout the power system until an equilibrium state is reached.

According to a first aspect of the present invention, there is provided a method in a power system which includes a protected unit adapted to convey power from a first position in the protected unit to a second position in the protected unit, or vice versa, via a plurality of conductors. The first position may be different from the second position. On a condition that a fault occurs in the protected unit, at least one travelling wave may be generated in the protected unit, wherein any distortion, attenuation and/or delay of the waveform of a wave due to propagation of the wave in the protected unit can be modeled by means of a propagation function. The method comprises determining a first travelling wave current in the first position and a second travelling wave current in the second position. A first travelling wave differential current is determined based on a comparison between the determined first travelling wave current or the second travelling wave current and an estimation of the first travelling wave current or the second travelling wave current, respectively. Estimation of the first travelling wave current or the second travelling wave current is carried out by applying the propagation function to the second travelling wave current or to the first travelling wave current, respectively. The first travelling wave differential current has a plurality of modes which correspond to respective ones of the plurality of conductors. A second travelling wave differential current is determined by means of, based on the propagation function, adjusting at least one of magnitude and phase of the first travelling wave differential current such that all modes attain equal or increasingly equal modal characteristics.

A method according to the first aspect may for example be utilized in a protection algorithm based on travelling-wave based differential protection, which is capable of sensing a fault in the protected unit.

According to the first aspect, a first travelling wave differential current is determined by means of a comparison between the determined first travelling wave current or the second travelling wave current, and an estimation of the first travelling wave current or the second travelling wave current, respectively, where the estimation of the first travelling wave current or the second travelling wave current is carried out by applying the propagation function to the second travelling wave current or to the first travelling wave current, respectively. Hence, a travelling wave differential current is determined for one of the first and second positions by comparing a travelling wave current determined in that position with an estimation of a travelling wave current in that position, which has been estimated based on a travelling wave current in the other one of the first and second positions and the propagation function, which takes into account and/or introduces the effect of any distortion, attenuation and/or delay of the waveform of a wave due to propagation of the wave in the protected unit or transmission line. The comparison between the determined first travelling wave current or the second travelling wave current, and the estimation of the first travelling wave current or the second travelling wave current, respectively, may for example include determining a difference between the determined first travelling wave current or the second travelling wave current, and the estimation of the first travelling wave current or the second travelling wave current, respectively.

By utilizing the propagation function in the estimation of the first travelling wave current or the second travelling wave current, any non-negligible distortion, attenuation and/or delay of the waveform of a wave due to the propagation of the wave in the protected unit or transmission line may be accounted for. Thereby, a relatively high reliability and/or accuracy may be achieved in fault sensing based on the first travelling wave differential current, not only for protected unit configurations such as OHL where distortion of the waveform of travelling waves generally is small and can be neglected, but also for other configurations such as DC cables where distortion of the waveform of travelling waves is not negligible.

The propagation function may for example be determined or estimated by means of time-domain simulation techniques that provide a relatively accurate representation of the frequency dependent propagation function. Such time-domain simulation techniques may be based on or be constituted by for example PSCAD®, also known as PSCAD®/EMTDC™, developed by Manitoba HVDC Research Centre, 211 Commerce Drive, Winnipeg, Manitoba, R3P 1A3, Canada.

The first travelling wave current may be determined based on at least one first current and at least one first voltage, respectively, sensed in the first position. The second travelling wave current may be determined based on at least one second current and at least one second voltage, respectively, sensed in the second position.

The first and second positions may for example be positions at the ends of a transmission line, the protected unit being constituted by or including the transmission line. Hence the first travelling wave current may represent a first line end or position on the transmission line, and the second travelling wave current may represent a second line end or position on the transmission line.

The first travelling wave current and the second travelling wave current may for example be determined based on the current and voltage sensed in the respective first and second positions, or line ends, and possibly further based on an estimated surge admittance of the protected unit.

A time-shift between the travelling wave currents at the first and second positions, or at the transmission line ends, may be applied so as to compensate for the travelling time of the wave travelling between the first and second positions or transmission line ends. This will be further described in the following.

Based on the determined first travelling wave differential current, there may then be determined whether there is a fault in the protected unit. If the determined travelling wave current and the estimated travelling wave current differ according to some predefined criteria, this may be taken as meaning that there is an abnormal or unexpected current path existing in the protected unit, which may imply that there is a fault in the protected unit.

For a multi-conductor protected unit, e.g. a multi-conductor transmission line, with n conductors, the first travelling wave differential current is generally in the form of a differential current vector with n elements, where each element may correspond to one of the conductors.

The frequency dependent properties of the propagation function (delay and attenuation/distortion), and possibly surge admittance, may be represented by means of rational approximations, which can be implemented in the time domain with relative ease. A protection scheme based on the first travelling wave differential current has been found to be stable during transients caused by external disturbances which otherwise might cause a conventional differential protection method to misoperate. Since the protection scheme based on the first travelling wave differential current may account for the frequency-dependent propagation function, and possibly surge admittance, it is contemplated that it in principle can be applied to any type of transmission line, e.g. DC cable or OHL. Furthermore, by transforming the propagation function matrices, and possibly surge admittance matrices, into phase quantities in the frequency domain, a protection scheme based on the first travelling wave differential current may be applied to any configuration of transmission lines with any number of conductors, even if the transformation matrices are frequency dependent.

The protected unit may for example comprise a DC transmission line, such as a HVDC transmission line, or several DC or HVDC transmission lines e.g. arranged in a grid. HVDC transmission lines may be arranged in configurations such a bipole or a symmetrical monopole configuration. For symmetrical monopole configurations, all faults may require a symmetrical action. For example, pole-to-pole or pole-to-ground faults may both require both conductors to be disconnected, even if the fault only involves one of the conductors. For all external faults, and also for internal faults which may occur close to or at the receiving line end of the transmission line (with respect to a wave travelling in the transmission line), the elements of the first travelling wave differential current will in general contain no false differential current for 'healthy', i.e. non-faulty, phases or conductors. However, during internal faults, at least for those that may occur close to or at the sending line end, coupling effects between conductors might result in a false differential current in elements of the first travelling wave differential current which do correspond to healthy conductors. For symmetrical monopole configurations this is usually not an issue, since in that case the faulted conductors do not need to be identified. However, in some cases, such as for example in a bipole HVDC transmission scheme, the healthy conductor is required to remain in operation during asymmetrical faults, i.e. pole-to-ground. This may require an ability to differentiate between different types of faults, i.e. to determine which of the conductors that is faulted. According to the first aspect, in order to be able to mitigate or even eliminate indication of 'false' differential currents in healthy conductors during internal faults which occur close to or at the sending line end, a second travelling wave differential current is determined by means of adjustment of at least one of magnitude and phase of the first travelling wave differential current such that all modes attain equal or increasingly equal modal characteristics. The adjustment is at least in part based on the propagation function.

It has been found that coupling between conductors is at least in part due to the propagation function of the line section between the point where the fault occurs and the receiving line end. From an investigation of the propagation function it has been concluded that the frequency domain properties (delay and attenuation/distortion) of a protected unit e.g. in the form of a transmission line are due to the existence of different modes of travelling waves. Since each mode has its respective propagation velocity and distortion, the extent of difference will increase with line length, which consequently implies that the maximum amount of false differential current for a given transmission line, i.e. a 'worst case' scenario, will occur during faults close to or at the sending line end, i.e. when the distance between receiving end and the position in which the fault occurs is the largest. For a multi-conductor protected unit, e.g. a multi-conductor transmission line, with n conductors, the first travelling wave differential current can be expressed in the phase domain as a differential current vector with n elements.

By determining a second travelling wave differential current, by means of adjustment of at least one of magnitude and phase of the first travelling wave differential current such that all modes attain equal or increasingly equal modal characteristics, modal domain differences in the above-mentioned propagation function may be 'filtered out' for faults occurring close to or at the (travelling wave) 'sending' line end or position. Thereby, indication of false differential currents in healthy conductors even during the worst case scenario as discussed above may be eliminated. The second travelling wave differential current may be seen as a phase domain normalized version of the first travelling wave differential current.

In a multi-conductor protected unit or transmission line, there are generally several mutually coupled phases or conductors, with one mode for each phase that is mutually coupled. Each mode may be modeled as an independent, single-phase transmission line. For unbalanced transmission lines, the modes will have different surge impedances and travel times. Usually there are two different types of modes. Firstly, there is the ground mode, or common mode or zero sequence mode. This mode is in general active whenever ground currents flow in the system. Secondly, the remaining modes are known as metallic modes, or differential modes or positive and negative sequence modes. The ground mode is normally associated with a longer travel time, lower characteristic admittance and a larger resistance than the metallic modes.

As indicated above, a false differential current in healthy conductors may appear due to the different properties of each modal propagation function. According to an example, for adjusting at least one of magnitude and phase of the first travelling wave differential current, such that all modes attain equal or increasingly equal modal characteristics, a slowest one (or one of the slowest) of the modes of the first travelling wave differential current is identified. The slowest mode may be a mode of the first travelling wave differential current which has a largest propagation delay. The slowest mode is often the ground mode. Delays and low pass functions may then be applied to all other modes of the first travelling wave differential current such that the elements of the thus determined second travelling wave differential current will have equal time delay and attenuation and/or distortion during the worst case scenario, i.e. during faults close to or at the sending line end, i.e. when the distance between receiving end and the position in which the fault occurs is the largest.

Hence, based on the first travelling wave differential current, a mode of the first travelling wave differential current having a largest propagation delay may be identified.

The adjustment of at least one of magnitude and phase of the first travelling wave differential current such that all modes attain equal or increasingly equal modal characteristics may for example be based on the propagation function for the identified mode, or the propagation function evaluated for the identified mode. For example, at least one of magnitude and phase of the first travelling wave differential current may be adjusted such that all modes attain equal or increasingly equal arrival times at the first or second position and/or evolution as a function of time.

Identification of a mode of the first travelling wave differential current mode having a largest propagation delay based on the first travelling wave differential current may for example comprise comparing eigenvalues associated with the modes of the first travelling wave differential current. For example, magnitudes of eigenvalues associated with the modes of the first travelling wave differential current may be compared, so as to identify a mode of the first travelling wave differential current having a largest propagation delay.

According to an example, after the slowest mode (or a slowest mode) has been identified, a normalization matrix in modal domain is constructed based on a combination of the propagation function of the slowest mode and the inverse of the modal domain propagation function. The result of application of the normalization matrix to the first travelling wave differential current is a normalized differential current vector, which has been referred to in the foregoing as the second travelling wave differential current, in the elements of which a differential current will only be present in an element which corresponds to a faulty, non-healthy phase.

In the second travelling wave differential current, which in view of the foregoing description in general may be a vector, the elements may be 'filtered' by a minimum phase shift function of the identified slowest mode, and delayed by the propagation delay of the slowest mode. In general no additional delays are applied to the first travelling wave differential current, since the faulted phase may not be identified until all modes have arrived at the receiving line end or position. The delays and filters may be applied to all of the modes other than the slowest mode (or the slowest modes), such that all of the modes attain equal or substantially equal properties with respect to arrival times and/or other modal characteristics, e.g. with respect to the modes' evolvement as a function of time, during the fault.

For internal faults which may occur close to or at the receiving line end of the transmission line or protected unit, the elements of the first travelling wave differential current will in general not include any false differential current for healthy phases or conductors. However, during internal faults which may occur close to or at the sending line end of the transmission line or protected unit, elements of the first travelling wave differential current which do correspond to healthy conductors may include false differential currents.

However, in the elements of the second travelling wave differential current a differential current may only be present in an element which corresponds to a faulty, non-healthy phase in case of internal faults which may occur close to or at the sending line end of the transmission line or protected unit. This suggests, depending on the location in a transmission line or protected unit at which a fault will, or is expected to, occur, that either the first travelling wave differential current or the second travelling wave differential current should be chosen as input to a decision logic or the like which determines or assesses whether there is a fault in the transmission line or protected unit or not. The first travelling wave differential current and the second travelling wave differential current may each in a sense be considered to represent a 'boundary' of the transmission line or protected unit. Since it in general is not known at which location in a transmission line or protected unit a fault will occur, the first travelling wave differential current and the second travelling wave differential current may according to an example be combined such that indication of any false differential current for healthy conductors may be mitigated or even eliminated irrespectively of where in the transmission line or protected unit a fault occurs. The result from the combination may be input into a decision logic or the like which determines or assesses whether there is a fault in the transmission line or protected unit or not.

Hence, a third travelling wave differential current may be determined based on a combination of the first travelling wave differential current and the second travelling wave differential current.

For example, in case each of the first travelling wave differential current and the second travelling wave differential current comprises a plurality of elements, the third travelling wave differential current may be determined by means of element-by-element multiplication of the first travelling wave differential current and the second travelling wave differential current. Each element in the first travelling wave differential current and the second travelling wave differential current, respectively, may correspond to a respective one of the plurality of conductors. During internal faults occurring either close to or at the receiving line end of the transmission line or protected unit, or close to or at the sending line end of the transmission line or protected unit, at least one of the respective elements corresponding to a healthy conductor in the first travelling wave differential current and the second travelling wave differential current may be zero or substantially zero, which may make the product of those elements zero or substantially zero as well.

As will be further described in the following, any element of the third travelling wave differential current which has a negative value may be discarded or disregarded in an assessment or determination, e.g. carried out by the above-mentioned decision logic, whether there is a fault in the transmission line or protected unit or not. This may allow for mitigating or even eliminating indication of any false differential current for healthy conductors in the third travelling wave differential current, irrespectively of where in the transmission line or protected unit a fault occurs.

On a condition that the first travelling wave current is estimated, there may be determined a time when the first travelling wave current was determined.

On a condition that the second travelling wave current is estimated, there may be determined a time when the second travelling wave current was determined.

The determined time(s) may be a time or time instance(s) when the first travelling wave current in the first position and/or the second travelling wave current in the second position in the protected unit was/were evaluated or derived, and/or a time or time instance(s) when voltage and/or current in the first position and/or the second position, respectively, was/were such so as to result in the first travelling wave current and/or the second travelling wave current, as determined.

A time-shift function may be determined based on the determined time(s) and a propagation time period of a wave travelling from the first position to the second position, or vice versa.

The estimation of the first travelling wave current or the second travelling wave current may be carried out by applying the time-shift function to the propagation function so as to obtain a time-shifted propagation function and applying the time-shifted propagation function to the second travelling wave current or to the first travelling wave current, respectively.

The propagation function which is used in estimating at least one of the first travelling wave current and/or the second travelling wave current may hence be a modified one, modified by application of the time-shift function to the 'original' propagation function. In alternative or in addition, the time-shift function may be determined based on transmitting a signal from the first position to the second position, or vice versa, and upon receipt of the signal at the second position or first position, respectively, transmit a signal from the second position or the first position, respectively, back to the first position to the second position, respectively. The time-shift function may be determined based on the travelling times of the signals back and forth between the first and second positions and possibly also a 'turn-around' time between receipt of the signal at the first position or second position and transmission of a signal therefrom to the second position or first position, respectively.

According to an embodiment, at least one first current and at least one first voltage, respectively, in the first position, may be sensed or measured. In alternative or in addition, at least one second current and at least one second voltage, respectively, in the second position, may be sensed or measured. The first travelling wave current may be determined based on the at least one first current and the at least one first voltage, and the second travelling wave current is determined based on the at least one second current and the at least one second voltage.

Sensing or measuring of the at least one second current and the at least one second voltage, respectively, may be performed subsequent to sensing the at least one first current and the at least one first voltage, respectively, or vice versa.

In alternative or in addition, sensing of the at least one first current may be performed simultaneously or substantially simultaneously with sensing of the at least one first voltage.

In alternative or in addition, sensing of the at least one second current may be performed simultaneously or substantially simultaneously with sensing of the at least one second voltage.

The time when the first travelling wave current was determined may be based on a time when the at least one first current and the at least one first voltage, respectively, was sensed.

The time when the second travelling wave current was determined may be based on a time when the at least one second current and the at least one second voltage, respectively, was sensed.

Determination of the first travelling wave current and/or the second travelling wave current may be based on an estimated surge admittance of the protected unit. The surge admittance may for example be determined or estimated by means of time-domain simulation techniques that provide a relatively accurate representation of the frequency dependent surge admittance. Such time-domain simulation techniques may be based on or be constituted by for example PSCAD®.

According to a second aspect, there is provided a processing module for use in a power system which includes a protected unit adapted to convey power from a first position in the protected unit to a second position, different from the first position, in the protected unit, or vice versa, via a plurality of conductors. On a condition that a fault occurs in the protected unit, at least one travelling wave is generated in the protected unit, wherein any distortion, attenuation and/or delay of the waveform of a wave due to propagation of the wave in the protected unit can be modeled by means of a propagation function. The processing module may be configured to model any distortion, attenuation and/or delay of the waveform of a wave due to propagation of the wave in the protected unit by means of the propagation function. The processing module is configured to determine a first travelling wave current in the first position and a second travelling wave current in the second position. The processing module is configured to determine a first travelling wave differential current based on a comparison between the determined first travelling wave current or the second travelling wave current and an estimation of the first travelling wave current or the second travelling wave current, respectively. The processing module is configured to estimate the first travelling wave current or the second travelling wave current by applying the propagation function to the second travelling wave current or to the first travelling wave current, respectively, wherein the first travelling wave differential current has a plurality of modes corresponding to respective ones of the plurality of conductors. The processing module is configured to determine a second travelling wave differential current by means of, based on the propagation function, adjustment of at least one of magnitude and phase of the first travelling wave differential current such that all modes attain equal or increasingly equal modal characteristics.

The processing module may include or be constituted by any suitable central processing unit (CPU), microcontroller, digital signal processor (DSP), Application Specific Integrated Circuit (ASIC), Field Programmable Gate Array (FPGA), etc., or any combination thereof. The processing module may optionally be capable of executing software instructions stored in a computer program product e.g. in the form of a memory. The memory may for example be any combination of read and write memory (RAM) and read only memory (ROM). The memory may comprise persistent storage, which for example can be a magnetic memory, an optical memory, a solid state memory or a remotely mounted memory, or any combination thereof.

The processing module may be configured to receive the first travelling wave current and the second travelling wave current from a travelling wave current sensing module included in the power system, which travelling wave current sensing module is configured to determine a first travelling wave current in the first position and a second travelling wave current in the second position. The first travelling wave current and the second travelling wave current may then be determined by the processing module by receipt of first travelling wave current and the second travelling wave current from the travelling wave current sensing module.

Similarly to what has been described in the foregoing, the processing module may be configured to determine a third travelling wave differential current based on a combination of the first travelling wave differential current and the second travelling wave differential current. Each of the first travelling wave differential current and the second travelling wave differential current may comprise a plurality of elements. The processing module may be configured to determine the third travelling wave differential current by means of element-by-element multiplication of the first travelling wave differential current and the second travelling wave differential current.

According to a third aspect, there is provided a fault sensing system for a power system including a protected unit adapted to convey power from a first position in the protected unit to a second position, different from the first position, in the protected unit, or vice versa, via a plurality of conductors. On a condition that a fault occurs in the protected unit at least one travelling wave is generated in the protected unit. The fault sensing system is adapted to sense a fault in the protected unit. The fault sensing system comprises a processing module according to the second aspect. A second travelling wave differential current as determined by the processing module has a plurality of elements, each element corresponding to a respective one of the plurality of conductors. The fault sensing system is configured to compare at least some of the elements of the second travelling wave differential current with respect to a fault sensing criterion, and on a condition that an element complies with the fault sensing criterion, determine that there is a fault in the conductor corresponding to that element.

The comparison of at least some of the elements of the second travelling wave differential current with respect to a fault sensing criterion may for example be carried out by the processing module, and/or by some other, possibly for that purpose dedicated, entity arranged in the fault sensing system or elsewhere in the power system.

On a condition that there is determined that there is a fault in the protected unit, or a fault in a conductor included in the protected unit, the protected unit, or at least the conductor or conductors in which a fault has been determined to occur, may be isolated from at least a portion of the rest of the power system. Isolating the protected unit or at least one conductor included in the protected unit from at least a portion of the rest of the power system may be performed in different ways. According to one example, the power system may comprise at least one circuit breaker arranged at a first end of the protected unit and at least one circuit breaker arranged at a second end of the protected unit, wherein the first position is arranged at the first end and the second position is arranged at the second end. Isolating the protected unit from at least a portion of the rest of the power system may comprise opening the at least one circuit breaker at the first and second ends, respectively. A similar arrangement of at least one circuit breaker may be used in order to isolate an individual conductor or conductors included in the protected unit from at least a portion of the rest of the power system.

The processing module included in the fault sensing system may be configured to determine a third travelling wave differential current based on a combination of the first travelling wave differential current and the second travelling wave differential current, such as described in the foregoing. The third travelling wave differential current as determined by the processing module may have a plurality of elements, each element corresponding to a respective one of the plurality of conductors.

The fault sensing system may be configured to assess or compare at least some of the elements of the third travelling wave differential current, or at least some of the elements of the first travelling wave differential current and/or the second travelling wave differential current, with respect to a fault sensing criterion. The fault sensing system may be configured to, on a condition that an element complies with the fault sensing criterion, determine that there is a fault in the conductor corresponding to that element. The fault sensing criterion may for example include whether an element complies with a predefined fault sensing metric, for example whether a magnitude or an absolute value of the element exceeds a predefined threshold value. If a magnitude or an absolute value of the element exceeds the predefined threshold value, a fault in the conductor corresponding to that element may be declared, and otherwise, there may be declared that there is not a fault in the conductor corresponding to that element.

In alternative or in addition, the fault sensing criterion may for example be based on detection techniques such as time-inverse overcurrent characteristic, which may permit faster actuation of fault protection equipment, e.g. tripping of circuit breakers, in case of low impedance faults in contrast to high impedance faults where a comparatively small differential current might be allowed to flow for some period of time, and allow for unsymmetrical protection actions. Hence, the larger the fault current, the faster the actuation of the fault protection equipment may become. In alternative or in addition, the fault sensing criterion may be based on detection techniques such as differential-restrain or current restraining characteristic, for which in assessment of whether there is a fault in conductors of the protected unit an overcurrent sustained during a certain time period may be used as an indication of presence of a fault, allowing for unsymmetrical protection actions.

According to an embodiment of the present invention, the fault sensing system may be configured to exclude, discard or disregard any element of the third travelling wave differential current which has a negative value in the assessment of at least some of the elements of the third travelling wave differential current.

According to a fourth aspect, there is provided a power system comprising a protected unit adapted to convey power from a first position in the protected unit to a second position, different from the first position, in the protected unit, or vice versa, via a plurality of conductors. The power system comprises a processing module according to the second aspect, and possibly a fault sensing system according to the third aspect.

The power system may include at least one current sensing unit configured to sense at least one first current in the first position, and at least one second current in the second position, and/or at least one voltage sensing unit configured to sense at least one first voltage in the first position and at least one second voltage in the second position. According to examples, the at least one current sensing unit and/or the at least one voltage sensing unit may be included in the processing module according to the second aspect, the fault sensing system according to the third aspect, and/or in the travelling wave current sensing module as described above.

The power system may include a memory unit for storing data, e.g. the determined or measured time when the respective currents or voltages were sensed, and/or a clock unit for measuring or keeping track of time. According to examples, the memory unit and/or the clock unit may be included in the processing module according to the second aspect, the fault sensing system according to the third aspect, and/or in the travelling wave current sensing module as described above.

The protected unit may for example comprise a DC transmission line.

The power system may for example comprise a HVDC power transmission system.

According to a fifth aspect, there is provided a computer program product configured to, when executed in a processing module according to the second aspect, perform a method according to the first aspect.

According to a sixth aspect, there is provided a computer-readable storage medium on which there is stored a computer program product configured to, when executed in a processing module according to the second aspect, perform a method according to the first aspect.

HVDC transmission lines may be arranged in configurations such as monopole, symmetric monopole, or bipolar configurations. For example, a bipolar HVDC transmission line comprises a positive pole line, a negative pole line, and a metallic return line connected to ground. Faults that may occur on a bipolar HVDC transmission line include positive pole to negative pole short circuits, positive pole to ground short circuits, and negative pole to ground short circuits. Embodiments of the present invention may for example be implemented in the positive pole line and/or the negative pole line of a bipolar HVDC transmission line, or in other transmission line configurations that can be envisaged by a person skilled in the art. In other words, the protected unit may be included in the positive pole line and/or the negative pole line of a bipolar HVDC transmission line, or in another transmission line configuration.

According to embodiments of the present invention, the power system is an Alternating Current (AC) based power system, a DC based power system, or possibly a power system based on a combination of AC and DC components or constituents. Principles of embodiments of the present invention are applicable in an AC based power system or a DC based power system in the same or substantially the same way, since embodiments of the present invention are based on equations for e.g. voltage and current in a transmission line and are insensitive to if the voltage source is an AC voltage source or a DC voltage source.

Further objects and advantages of the present invention are described in the following by means of exemplifying embodiments.

It is noted that the present invention relates to all possible combinations of features recited in the claims. Further features of, and advantages with, the present invention will become apparent when studying the appended claims and the following description. Those skilled in the art realize that different features of the present invention can be combined to create embodiments other than those described in the following.

BRIEF DESCRIPTION OF THE DRAWINGS

Exemplifying embodiments of the invention will be described below with reference to the other accompanying drawings, in which:

FIG. 4 is a schematic illustration of propagation speeds of travelling wave modes of a travelling wave propagating along a transmission line according to an example, for illustrating principles of embodiments of the present invention.

FIG. 5 is a schematic illustration of phase shift, or time delay, property of a normalization matrix according to an example, for illustrating principles of embodiments of the present invention.

FIG. 7 is a schematic block diagram of a processing module according to an embodiment of the present invention.

FIG. 9 is a schematic view of computer-readable means carrying computer program code according to embodiments of the present invention.

In the accompanying drawings, the same reference numerals denote the same or similar elements throughout the views.

DETAILED DESCRIPTION

The present invention will now be described hereinafter with reference to the accompanying drawings, in which exemplifying embodiments of the present invention are illustrated. The present invention may, however, be embodied in many different forms and should not be construed as limited to the embodiments set forth herein; rather, these embodiments are provided by way of example so that this disclosure will convey the scope of the invention to those skilled in the art. Furthermore, like numbers refer to like or similar elements or components throughout. The steps of any method described herein do not have to be performed in the exact order as described, unless specifically stated.

Figure 1:
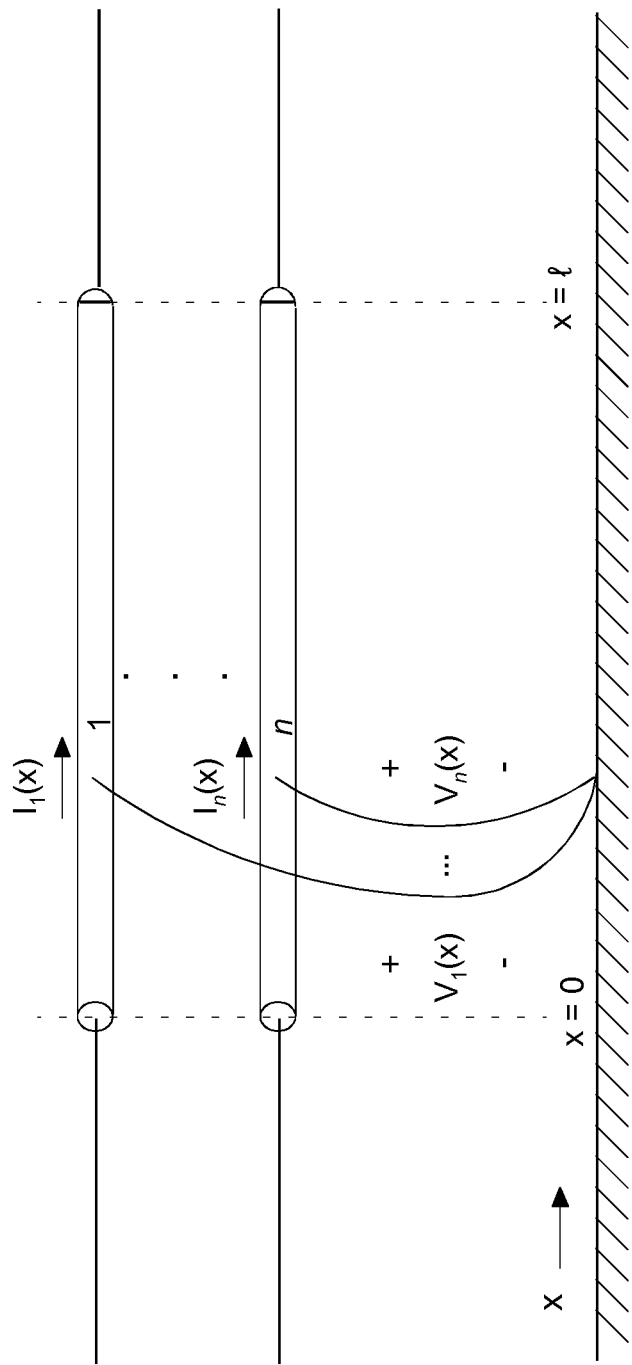
FIG. 1 is a schematic view of a transmission line of length l for illustrating principles of embodiments of the present invention.

FIG. 1 is a schematic view of a transmission line of length l for illustrating principles of embodiments of the present invention. Transmission lines used in power systems usually include several conductors where each conductor will experience a mutual coupling with the other conductors. In the general case with n conductors, denoted 1, . . . , n in FIG. 1, the per-unit length impedance matrix Z and admittance matrix Y are both square and symmetrical matrices of dimension n×n. By constructing and solving the so called telegrapher's equation a solution for voltage and current at location x can be obtained (both voltage and current are column vectors of size n×1) as shown in equations (1) and (2):

$$I_x = e^{-\Gamma x}I^+ + e^{+\Gamma x}I^- \quad (1)$$

$$V_x = Y_c^{-1}e^{-\Gamma x}I^+ - Y_c^{-1}e^{+\Gamma x}I^- = \quad (2)$$
$$= Y_c^{-1}(e^{-\Gamma x}I^+ - e^{+\Gamma x}I^-)$$

where $\Gamma=\sqrt{YZ}$ is a matrix, I+ and I− are column vectors including the forward and backward traveling currents, respectively, and $$Y_c = \sqrt{(YZ)^{-1}}Y \quad (3)$$

$$Z_c = Y_c^{-1} \quad (4)$$

$Y_c$ is the surge adittance matrix and $Z_c$ is the surge impedance matrix.

Figure 2:
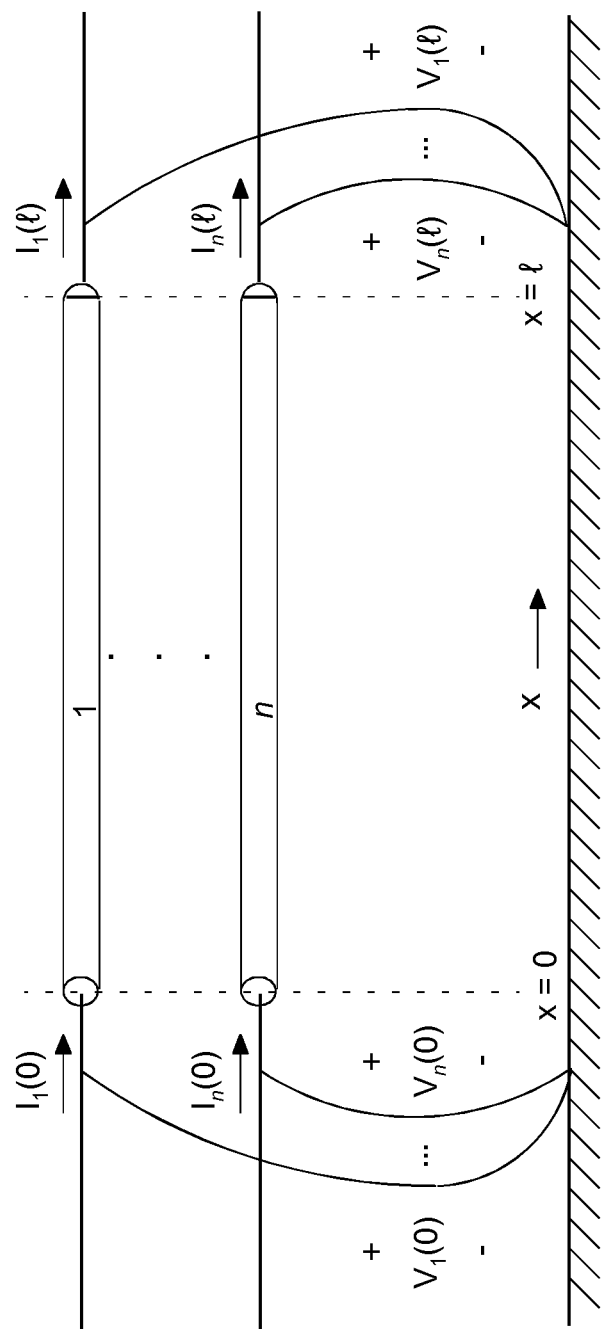
FIGS. 2 and 3 are schematic views of two-ended, multi-conductor transmission lines of length l for illustrating principles of embodiments of the present invention.

FIG. 2 is a schematic view of a two-ended, multi-conductor transmission line of length l for illustrating principles of embodiments of the present invention. The conductors are denoted by 1, . . . , n in FIG. 2. Assume that the forward traveling wave current (column vector of size n×1), $I_{TWx}$, is defined and calculated at location x along the transmission line as shown in equation (5):

$$I_{TWx}^+ = I_x + Y_C V_x \quad (5)$$

Inserting the expressions for current and voltage in equations (1) and (2), respectively, into equation (5) yields:

$$I_{TWx}^+ = 2e^{-\Gamma x}I^+ \quad (6)$$

Calculating $I_{TWx}$ at both ends of the transmission line, x=0 and x=l, gives:

$$I_{TW0}^+ = 2I^+ \quad (7)$$

$$I_{TWl}^+ = 2e^{-\Gamma l}I^+ = \quad (8)$$
$$= e^{-\Gamma l}I_{TW0}^+ =$$
$$= HI_{TW0}^+$$

where $$H = e^{-\sqrt{YZ}l} \quad (9)$$

is the propagation function matrix. If the detecting part of the protection scheme is assumed to be located at x=l, the phase domain column vector of traveling wave differential currents can be formulated as:

$$I_{TWdiff} = HI_{TW0}^+ - I_{TWl}^+ \quad (10)$$

Without losing any generality but merely in order to simplify the discussion, a protection scheme with only half-duplex communication can be assumed where the sending end is located at x=0 and the receiving end is located at x=l. However, the protection scheme can be mirrored such that faults can be detected at either end where both sides equally transmit and receive samples to the other station or side.

During an internal fault, the phase-domain differential current seen by the protection scheme may be present in healthy phases due to the modal properties of the propagation function matrix. A worst case scenario may occur when the internal fault is located at the remote end in relation to the protection scheme, i.e. the fault is located close to the sending end of the protection scheme.

Figure 3:
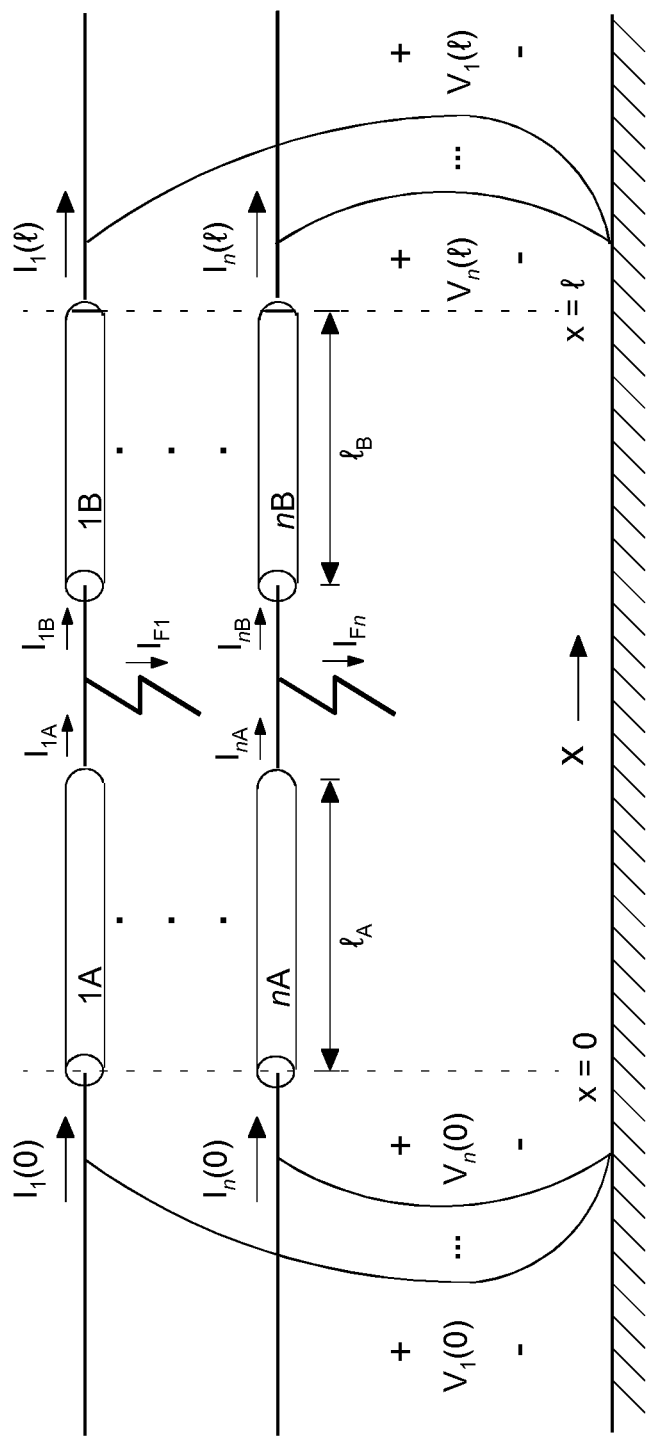

Consider a multi-conductor transmission line of length l and having n conductors as illustrated in FIG. 3, which is a schematic view for illustrating principles of embodiments of the present invention. The conductors are denoted by indices 1, . . . , n in FIG. 3. Both voltages and currents may be measured in each end of the transmission line with the polarities defined as shown in FIG. 3. Without losing any generality but merely in order to simplify the discussion, a single-ended protection scheme is assumed where the left-hand side of the transmission line (x=0) may be assumed to be the sending end and the right-hand side of the transmission line (x=l) is assumed to be the receiving end where the determination of differential current is carried out.

If a fault is assumed to occur at some distance $l_A$ from the sending end, the transmission line can be divided into two transmission line sections, denoted by indices A and B, respectively, in FIG. 3, having lengths $l_A$ and $l_B$, where $l = l_A + l_B$. Since both transmission line sections have the same per-unit length impedance Z and admittance Y, the surge admittance matrix $Y_c$ will be equal for both sections. The propagation function matrices of the two transmission line sections, $H_{lA}$ and $H_{lB}$ are however dependent on the respective lengths and will therefore not be equal in a general case. Using equation (9) together with the notation of $\Gamma=\sqrt{YZ}$ from equations (1) and (2), the propagation function matrix of each section A and B can be expressed as shown below in equations (11) and (12), respectively:

$$H_{lA} = e^{-\Gamma l_A} \quad (11)$$

$$H_{lB} = e^{-\Gamma l_B} \quad (12)$$

The propagation function matrix H of the entire transmission line length l equals the matrix multiplication of the two sections A and B:

$$H = H_{lA}H_{lB} = H_{lB}H_{lA} = e^{-\Gamma l_A}e^{-\Gamma l_B} = e^{-\Gamma(l_A+l_B)} = e^{-\Gamma l} \quad (13)$$

Using equations (8) and (5) to relate the voltages and currents at each side of both transmission line sections gives:

$$I_A + Y_c V_A = H_{lA}(I_0 + Y_c V_0) \quad (14)$$

$$I_l + Y_c V_l = H_{lB}(I_B + Y_c V_B) \quad (15)$$

The voltage between section A and B must be equal since it is the same electrical node, i.e. $V_A = V_B = V_{AB}$ (not shown in FIG. 3). Making this substitution and left-hand multiplying equation (15) with $(H_{lB})^{-1}$ and rearranging yields:

$$Y_c V_{AB} = H_{lA}(I_0 + Y_c V_0) - I_A \quad (16)$$

$$Y_c V_{AB} = H_{lB}^{-1}(I_l + Y_c V_l) - I_B \quad (17)$$

Setting the left-hand sides of equations (16) and (17) equal and identifying the traveling wave currents at both sides (x=0 and x=l) and rearranging yields:

$$H_{lB}^{-1}\underbrace{(I_l + Y_c V_l)}_{I_{TWl}^+} = H_{lA}\underbrace{(I_0 + Y_c V_0)}_{I_{TW0}^+} - \underbrace{(I_A - I_B)}_{I_F} \quad (18)$$

Note that $I_F$ is a column vector containing the phase domain fault currents in each respective conductor and is defined positive when the current is flowing out of the conductor according to FIG. 3. Left-hand side matrix multiplication with $H_{lB}$ gives the following expression of the receiving end travelling wave current:

$$I_{TWl}^+ = \underbrace{H_{lB}H_{lA}}_{H}I_{TW0}^+ - H_{lB}I_F \quad (19)$$

Inserting equation (19) into the formula for calculating the differential current according to equation (10) yields the differential current as seen by the protection scheme during this internal fault:

$$I_{TWdiff} = HI_{TW0}^+ - I_{TWl}^+ = \tag{20}$$
$$= HI_{TW0}^+ - HI_{TW0}^+ + H_{l_B}I_F =$$
$$= H_{l_B}I_F = e^{-\Gamma l_B}I_F$$

From the result in equation (20) the experienced differential current $I_{TWdiff}$ during an internal fault is related to the distance between the receiving transmission line end and the fault $l_B$.

Consider the case where $l_B=0$, where the $H_{l_B}$ matrix will be the identity matrix and consequently $I_{TWdiff}=I_F$, i.e. no off-diagonal matrix elements exist, and consequently no false differential current in healthy phases exists. In the opposite case where $l_B=1$, the $H_{l_B}$ matrix will be the full propagation function matrix of the transmission line, which typically includes off-diagonal elements. The amount of coupling that exist between the conductors is related to the eigenvalues of the YZ matrix and the length of the transmission line, as described further in the following.

From equation (9), the phase domain propagation function H of a transmission line with n conductors is related to the per-unit-length shunt admittance Y and series impedance Z matrices and the transmission line length l. The shunt admittance Y and series impedance Z matrices are both square (dimension n×n) and also symmetrical, i.e. $Y=Y^T$ and $Z=Z^T$, where T denotes matrix transpose. At every frequency, the matrix product YZ in the exponent in equation (9) can be transformed using eigenvalue decomposition. The eigenvalue equation describes the relation of the matrix A, eigenvalue $\lambda_k$ and eigenvector $v_k$, $$Av_k = \lambda_k v_k \tag{21}$$

The eigenvector $v_k$ is a column vector that corresponds to the eigenvalue $\lambda_k$. If the matrix A is of dimension n×n, there will be a total of n eigenvalue/eigenvector pairs. Combining all n eigenvalues and their respective eigenvectors into matrices yields:

$$Av = v\lambda \tag{22}$$

where v is a square matrix in which the eigenvectors are the columns and $\lambda$ is a diagonal matrix that contains each eigenvalue $\lambda_k$ in element kk. There is no defined order in which the eigenvalues should be sorted and that they can switch positions if required. However, the positions of the eigenvectors should then also be switched such that eigenvalue eigenvector relationship can be maintained. The eigenvalues can for example be sorted in increasing or decreasing order of magnitude. Inserting A=YZ and replacing the general notation of eigenvector matrix v with $T_i$ in equation (22):

$$YZT_i = T_i \lambda \tag{23}$$

$$T_i^{-1} YZ T_i = \lambda \tag{24}$$

Similarly, writing the corresponding equation of the matrix multiplication ZY that can be diagonalized into the same eigenvalues, $\lambda$, by applying a different eigenvector matrix $T_v$:

$$ZYT_v = T_v \lambda \tag{25}$$

$$T_v^{-1} ZY T_v = \lambda \tag{26}$$

Since Z and Y are both symmetrical matrices, i.e. $Y=Y^T$ and $Z=Z^T$:

$$T_v^{-1} Z^T Y^T T_v = \lambda \tag{27}$$

Transposing both sides of equation (27) yields:

$$(T_v^{-1} Z^T Y^T T_v)^T = \lambda^T \tag{28}$$

Since $(AB)^T = B^T A^T$ and the transpose of a diagonal matrix is the matrix itself, $(\lambda^T = \lambda)$, $$T_v^T YZ T_v^{-T} = \lambda \tag{29}$$

where $T_v^{-T}$ is the transposed inverse of $T_v$. Comparing the result in equation (29) with equation (24), the relation between transformation matrices $T_i$ and $T_v$ can be identified as:

$$\begin{cases} T_v^T = T_i^{-1} \\ T_v^{-T} = T_i \end{cases} \tag{30}$$

The result in equation (30) shows that the rows in the inverse current transformation matrix $T_i^{-1}$ are actually the corresponding columns of $T_v$, i.e. eigenvectors of the matrix product ZY. Note that the sets of eigenvectors in $T_i$ and $T_v$ in principle could be determined separately. However, since an eigenvector can be multiplied by a scalar $\alpha \neq 0$ and still fulfill the eigenvalue equation (21), the different eigenvectors in $T_i$ and $T_v$ must be scaled such that the relations in equation (30) are fulfilled. One way to achieve this is if the eigenvectors in $T_i$ and $T_v$ are scaled to unity. Another way is to determine one of the eigenvector matrices, then its inverse, and finally using the relations in equation (30) to produce the other set of eigenvectors if required. This also ensures the eigenvectors appear with correct scaling in relation to each other. Herein, only the transformation matrix $T_i$ and its inverse $T_i^{-1}$ are used. The eigenvectors in $T_i$ may for example be obtained using PSCAD/EMTDC, and are not normalized. Since the inverse $T_i^{-1}$ is calculated from the transformation matrix, scaling of eigenvectors is automatically compensated in the calculation of inverse since the product of both matrices equal the identity matrix.

A significance of the transformation matrices $T_i$ and $T_v$ are that they relate the modal and phase domains for currents and voltages respectively:

$$I_{phase} = T_i I_{mode} \tag{31}$$

$$V_{phase} = T_v V_{mode} \tag{32}$$

In some symmetrical cases (e.g. a flat two-conductor system or an ideally transposed three-phase transmission line), the per-unit length admittance Y and impedance matrices Z will consist of a repeated single entry in the diagonal and another single value in all non-diagonal elements. The matrix product YZ will then also be symmetric and therefore $YZ = (YZ)^T = Z^T Y^T = ZY$. This further implies that $T_i = T_v$ and that the inverse $T_i^{-1} = T_i^T = T_v^{-1} = T_v^T$. However, in the general case, transmission lines are not perfectly balanced and consequently $T_i \neq T_v$ since in general, $YZ \neq ZY$. The phase domain propagation function can also be expressed as the transform applied to the diagonal modal domain propagation function:

$$H = T_i H^m T_i^{-1} \tag{33}$$

In order to obtain the modal domain propagation function, the transformation matrices can be rearranged in the opposite order:

$$H^m = T_i^{-1} H T_i \tag{34}$$

The modal domain propagation function can be obtained from the eigenvalues λ from solving the eigenvalue equation in (23):

$$H^m = e^{-\sqrt{\lambda} l} \tag{35}$$

Since λ is a diagonal matrix where each $\lambda_k$ represents each uncoupled mode k, the modal domain propagation function matrix is also a diagonal matrix where each diagonal element corresponds to a mode. The propagation function in each mode k is:

$$H^{mk} = e^{-\sqrt{\lambda_k} l} \tag{36}$$

Each modal domain propagation function can be relatively accurately approximated as a combination of a minimum phase shift function and a time delay as shown in equation (37) below:

$$H^{mk}(s) \approx H'^{mk}(s) \cdot e^{-s\tau_k} \tag{37}$$

Every mode k in a transmission line (of length l) has its own respective propagation delay $\tau_k$, which implies that each mode also has its own individual propagation speed $v_k$. If all modes are launched down the transmission line from location x=0, they will appear at point x along the transmission line in a predetermined order, i.e. the mode with highest propagation speed will appear first, the second highest after that, and so on.

FIG. 4 is a schematic illustration of propagation speeds of travelling wave modes of a travelling wave propagating along a transmission line according to an example, for illustrating principles of embodiments of the present invention. According to the example in FIG. 4, a travelling wave including all modes is initiated at x=0. Each of the modes propagates down the transmission line at its respective propagation speed (illustrated by the length of each arrow $v_k$, k=1, 2, . . . , n). The left-hand graph in FIG. 4 illustrates the moment when the modal waves are initiated at t=0, and the right-hand graph in FIG. 4 illustrates the position of the wave fronts in each mode at t=$\tau_2$, i.e. when the mode with highest propagation speed arrives at the receiving line end according to this particular example.

In the time domain, the different modal propagation delays in combination with the characteristics of the minimum phase shift functions, ($H'^{mk}$) are the origins of false differential current in healthy phases, or conductors. Hypothetically, if these two properties would be common for all modes, the phase domain propagation function matrix could be expressed as the identity matrix multiplied with a common modal propagation function as illustrated in equation (38) below. Since the identity matrix by definition contains no off-diagonal elements, no false differential currents would appear in healthy conductors.

$$I_{TWdiff} = H I_F = T_i^{-1} H^m T_i I_F = \left\{\text{for all } k, \begin{matrix} \tau_k = \tau \\ H^{mk}(s) = H'(s) \end{matrix}\right\} \Rightarrow \Rightarrow \tag{38}$$

$$\begin{bmatrix} I_{TWdiff1} \\ I_{TWdiff2} \\ \vdots \\ I_{TWdiffn} \end{bmatrix} = H'(s) e^{-s\tau} \cdot \underbrace{T_i^{-1} I T_i}_{T_i^{-1} T_i = I} I_F = H'(s) e^{-s\tau} \cdot \begin{bmatrix} 1 & 0 & \cdots & 0 \\ 0 & 1 & \cdots & 0 \\ \vdots & \vdots & \ddots & \vdots \\ 0 & 0 & \cdots & 1 \end{bmatrix} \begin{bmatrix} I_{F1} \\ I_{F2} \\ \vdots \\ I_{Fn} \end{bmatrix}$$

Equation (38) should only be considered as an illustrative example, since the modes are usually not equal. The example could however illustrate a scenario when a fault occurs at $l_B$=0 since this would imply that H'(s)=1 and τ=0.

Usually there are two different types of modes. Firstly the ground mode which is active when ground current flows in the system. Secondly, the remaining modes are known as metallic modes. The ground mode normally possesses a longer travel time, lower characteristic admittance and a larger resistance than the metallic modes.

The result in equation (20) showed that the experienced differential current $I_{TWdiff}$ depend on the length $l_B$ from the receiving end at which the fault occurs. Since each mode in general has its own propagation speed, the difference between modes will obviously increase with line length, i.e. $l_B$=1 will be the 'worst' case for the differential protection scheme with regard to coupling between conductors and correctly identifying the faulted pole.

Assuming $l_B$=1 and inserting equations (33) and (35) into equation (20) results in equation (39) below which relates the experienced phase domain differential currents (IT-Wdiff) with respect to the phase currents in the fault location ($I_F$):

$$I_{TWdiff} = T_i H^m T_i^{-1} I_F = \tag{39}$$
$$= T_i e^{-\sqrt{\lambda} l} T_i^{-1} I_F$$

Using equation (37) in equation (39) yields:

$$I_{TWdiff} = \tag{40}$$

$$T_i \begin{bmatrix} H'^{m1}(s) \cdot e^{-s\tau_1} & 0 & \cdots & 0 \\ 0 & H'^{m2}(s) \cdot e^{-s\tau_2} & \cdots & 0 \\ \vdots & \vdots & \ddots & \vdots \\ 0 & 0 & \cdots & H'^{mn}(s) \cdot e^{-s\tau_n} \end{bmatrix} T_i^{-1} I_F$$

In order to better illustrate the impact of each mode in the phase domain, the diagonal modal propagation function matrix can be rewritten as a series of sparse matrices, each sparse matrix including only a single element:

$$I_{TWdiff} = \left( H'^{m1}(s) \cdot e^{-s\tau_1} T_i \begin{bmatrix} 1 & 0 & \cdots & 0 \\ 0 & 0 & \cdots & 0 \\ \vdots & \vdots & \ddots & \vdots \\ 0 & 0 & \cdots & 0 \end{bmatrix} T_i^{-1} + \right. \tag{41}$$

$$H'^{m2}(s) \cdot e^{-s\tau_2} T_i \begin{bmatrix} 0 & 0 & \cdots & 0 \\ 0 & 1 & \cdots & 0 \\ \vdots & \vdots & \ddots & \vdots \\ 0 & 0 & \cdots & 0 \end{bmatrix} T_i^{-1} + \ldots +$$

$$\left. H'^{mn}(s) \cdot e^{-s\tau_n} T_i \begin{bmatrix} 0 & 0 & \cdots & 0 \\ 0 & 0 & \cdots & 0 \\ \vdots & \vdots & \ddots & \vdots \\ 0 & 0 & \cdots & 1 \end{bmatrix} T_i^{-1} \right) I_F$$

The matrix multiplication in each mode can be further simplified. For the k-th mode, the product of the 3 matrix multiplications can be written as a multiplication of the k-th column in $T_i$ by the k-th row in $T_i^{-1}$. If the transformation matrix and its inverse are denoted $T_i=A$ and $T_i^{-1}=B$ respectively:

$$I_{TWdiff} = \left( H'^{m1}(s) \cdot e^{-s\tau_1} \begin{bmatrix} A_{11} \\ A_{21} \\ \vdots \\ A_{n1} \end{bmatrix} [B_{11} \quad B_{12} \quad \ldots \quad B_{1n}] + \right. \tag{42}$$

$$H'^{m2}(s) \cdot e^{-s\tau_2} \begin{bmatrix} A_{11} \\ A_{22} \\ \vdots \\ A_{n2} \end{bmatrix} [B_{21} \quad B_{22} \quad \ldots \quad B_{2n}] + \ldots +$$

$$\left. H'^{mn}(s) \cdot e^{-s\tau_n} \begin{bmatrix} A_{1n} \\ A_{2n} \\ \vdots \\ A_{nn} \end{bmatrix} [B_{n1} \quad B_{n2} \quad \ldots \quad B_{nn}] \right) I_F$$

Note that the matrix multiplication of the column and row vector will result in an n×n matrix which in the general case will contain complex elements. In equation (42) the experienced phase domain differential current $I_{TWdiff}$ during a fault $I_F$ can be analyzed. Each mode appears at the receiving transmission line-end at the time determined by its respective propagation delay $\tau_k$. In addition to the delay, the minimum phase shift function in each mode ($H'^{mk}$) will also apply low-pass' filters of different characteristics to each mode. The minimum phase shift functions $H'^{mk}$ in most conditions will approach the input as time increases and the entire expression within the parenthesis in equation (42) will therefore approach the identity matrix with time. The 'worst' crosstalk between conductors will therefore occur when the fault first arrives in the receiving end. It cannot be determined which conductors that are involved in a fault until all modes have arrived, i.e. the ground mode must be allowed to arrive.

As described in the foregoing, false differential current in healthy conductors may appear due to the different properties of each modal propagation function. A gist of embodiments of the present invention is to identify the slowest mode (usually the ground mode) and apply delays and low pass functions to all other modes, such that every element in the output vector will have equal time delay and attenuation/distortion during the fault in a worst case scenario. This may for example be implemented as applying a normalization matrix to the differential current $I_{TWdiff}$ so as to 'filter out' modal domain differences in the propagation function for faults located close to the sending end. In order to determine the normalization matrix, the mode that has the largest propagation delay is identified. Otherwise, some modes would have a positive time delay which would require the differential currents to be predicted when the protection scheme would be implemented in the time domain. The propagation delays for a given transmission line with n conductors (and n modes) of length l are sorted where the slowest mode will be denoted as $s_1$, followed by a mode denoted by $s_2$, and so on.

$$\{\tau_{s_1}, \tau_{s_2}, \ldots, \tau_{s_n}\} = \underset{max}{\mathrm{sort}}(\tau_1, \tau_2, \ldots, \tau_n) s_k \in \{1, 2, \ldots, n\} \tag{43}$$

Note that the mode with the longest propagation delay usually is the ground mode. Using the propagation function of mode $s_i$ together with the inverse of the modal domain propagation function matrix, the modal domain normalization matrix for a transmission line of length l can be determined as:

$$N_l^m = H'^{ms1}(s)(H^m)^{-1} \tag{44}$$

In the frequency domain the inverse of the propagation function matrix could be used. This could however translate into the time domain as a transfer function with positive time delays and highly unstable high-pass filters where the gain increases with frequency, and would probably not be practical. Since the modal propagation function matrix is diagonal, the inverse is simply the inverse of each diagonal element. Using the approximation in equation (37) and applying it to equation (44) yields:

$$N_l^m = \begin{bmatrix} \dfrac{H'^{ms1}(s) \cdot e^{-s\tau_{s_1}}}{H'^{m1}(s) \cdot e^{-s\tau_1}} & 0 & \ldots & 0 \\ 0 & \dfrac{H'^{ms1}(s) \cdot e^{-s\tau_{s_1}}}{H'^{m2}(s) \cdot e^{-s\tau_2}} & \ldots & 0 \\ \vdots & \vdots & \ddots & \vdots \\ 0 & 0 & \ldots & \dfrac{H'^{ms1}(s) \cdot e^{-s\tau_{s_1}}}{H'^{mn}(s) \cdot e^{-s\tau_n}} \end{bmatrix} \tag{45}$$

The diagonal element of the mode which was identified as the slowest mode, $s_1$, will cancel out and thus be 1 (no filter or delay). Further expansion of equation (45) yields:

$$N_l^m = \begin{bmatrix} \dfrac{H'^{ms1}(s)}{H'^{m1}(s)} \cdot e^{-s(\tau_{s_1}-\tau_1)} & 0 & \ldots & 0 \\ 0 & \dfrac{H'^{ms1}(s)}{H'^{m2}(s)} \cdot e^{-s(\tau_{s_1}-\tau_2)} & \ldots & 0 \\ \vdots & \vdots & \ddots & \vdots \\ 0 & 0 & \ldots & \dfrac{H'^{ms1}(s)}{H'^{mn}(s)} \cdot e^{-s(\tau_{s_1}-\tau_n)} \end{bmatrix} \tag{46}$$

The result in equation (46) may be interpreted as each element including a phase shift (delay in time-domain) and a quotient of two low-pass minimum phase shift functions. Since $\tau_{s_1}$ can be chosen as the maximum delay of all modes, the subtraction in the exponential will always be positive or zero (i.e. $\tau_{s_1}-\tau_k \geq 0$). This may ensure that the delay always has the 'correct' sign. Using the same transformation matrix as for the propagation function to relate modal and phase domain:

$$N_l = T_i N_l^m T_i^{-1} \tag{47}$$

$$N_l^m = T_i^{-1} N_l T_i \tag{48}$$

The normalization matrix can be applied to the differential current which the protection scheme experiences during a fault close to the sending end or station from equation (39) and determine the normalized differential current $\hat{I}_{TWdiff}$:

$$\hat{I}_{TWdiff} = N_l I_{TWdiff} = T_i N_l^m \underbrace{T_i^{-1} T_i}_{I} H^m T_i^{-1} I_F = T_i N_l^m H^m T_i^{-1} I_F \tag{49}$$

Inserting equations (40) and (46) into equation (49) yields:

$$\hat{I}_{TWdiff} = \tag{50}$$

$$T_i \begin{bmatrix} \frac{H'^{ms_1}(s)}{H'^{m1}(s)} \cdot & & & \\ e^{-s(\tau_{s_1}-\tau_1)} \cdot & 0 & \cdots & 0 \\ H'^{m1}(s) \cdot e^{-s\tau_1} & & & \\ & \frac{H'^{ms_1}(s)}{H'^{m2}(s)} \cdot & & \\ 0 & e^{-s(\tau_{s_1}-\tau_2)} \cdot & \cdots & 0 \\ & H'^{m2}(s) \cdot e^{-s\tau_2} & & \\ \vdots & \vdots & \ddots & \vdots \\ & & & \frac{H'^{ms_1}(s)}{H'^{mn}(s)} \cdot \\ 0 & 0 & \cdots & e^{-s(\tau_{s_1}-\tau_n)} \cdot \\ & & & H'^{mn}(s) \cdot e^{-s\tau_n} \end{bmatrix} T_i^{-1} I_F$$

Performing the cancellations in equation (50) yields:

$$\hat{I}_{TWdiff} = \tag{51}$$

$$H'^{ms_1}(s) \cdot e^{-s\tau_{s_1}} \cdot T_i \underbrace{\begin{bmatrix} 1 & 0 & \cdots & 0 \\ 0 & 1 & \cdots & 0 \\ \vdots & \vdots & \ddots & \vdots \\ 0 & 0 & \cdots & 1 \end{bmatrix}}_{T_i I T_i^{-1} = I} T_i^{-1} I_F = H'^{ms_1}(s) \cdot e^{-s\tau_{s_1}} \cdot I_F$$

Equation (51) indicates that in the normalized differential current $\hat{I}_{TWdiff}$ a differential current will only be present in the faulted phases. The output will appear as filtered by the minimum phase shift function of the slowest mode $s_1$, $H'^{ms_1}(s)$ and be delayed by the propagation delay of this mode, $\tau_{s_1}$. No additional delays have been introduced since the faulted phase cannot be identified until all modes have arrived at the receiving end. The delay and filter has been applied to the modes $k \neq s_1$ such that all modes have equal properties during this fault.

If only the time delay is considered, equation (46) can be interpreted as giving the slowest mode a 'head start' by means of delaying the other modes. This is illustrated by the example illustrated in FIG. 5 where all modes $k \neq s_1$ have been delayed, illustrated by the dots. FIG. 5 is a schematic illustration of the phase shift, or time delay, property of the normalization matrix according to an example, for illustrating principles of embodiments of the present invention. In FIG. 5, the mode $s_1$ is the slowest mode indicated by the shortest arrow, as illustrated in the left-most graph in FIG. 5. Application of the normalization matrix to $I_{TWdiff}$ delays all other modes $k \neq s_1$ with time $\tau_{s_1} - \tau_k$, which can be interpreted as increasing the distance which the other modes will travel such that when a fault occur at x=0, all modes arrive simultaneously in the receiving end at $t = \tau_{s_1}$, as illustrated in the right-most graph in FIG. 5. This implies that if the normalized waves are being observed at a point x<1 along the line, the modes will arrive in the reversed order as compared to the modes of $I_{TWdiff}$. The normalization matrix could in principle be calculated for any distance between the receiving end and the fault, $l_B$. This may however not be a practical solution, since it is difficult or even perhaps impossible to know where on the transmission line the fault will occur in advance. The normalization matrix may therefore be determined with respect to the entire transmission line length l.

It has been shown that for faults at $l_B=0$, the vector of differential current $I_{TWdiff}$ will contain no false differential current in healthy conductors. During faults at the other end of the line, i.e. at $l_B=1$, application of the normalization matrix to $I_{TWdiff}$ may mitigate or even eliminate any false differential current in healthy phases. Elements of the resulting vector of differential currents, $\hat{I}_{TWdiff}$, will only be non zero for elements which correspond to a non-healthy, faulty, phase. Since it is difficult or even perhaps impossible to know where on the transmission line that a fault will occur, a combination of $I_{TWdiff}$ and $\hat{I}_{TWdiff}$ is according to an example contemplated to be used as input to a decision logic or the like which determines or assesses whether there is a fault in the transmission line or not. Each of $I_{TWdiff}$ and $\hat{I}_{TWdiff}$ may in a sense be considered to represent a 'boundary' of the transmission line, such that false differential current always is eliminated in healthy conductors. The combination of $I_{TWdiff}$ and $\hat{I}_{TWdiff}$ may for example include making an element-by-element multiplication of $I_{TWdiff}$ and $\hat{I}_{TWdiff}$. During faults at either $l_B=0$ or $l_B=1$, an element in at least one of $I_{TWdiff}$ and $\hat{I}_{TWdiff}$ corresponding to a healthy conductor may contain a zero current, which consequently would make the product of the corresponding elements in $I_{TWdiff}$ and $\hat{I}_{TWdiff}$ zero as well. Formally defining the result of the element-by-element product of the two vectors as a third column vector $M_{TWdiff}$:

$$M_{TWdiff} = \text{diag}(I_{TWdiff}) \cdot \hat{I}_{TWdiff} = \text{diag}(\hat{I}_{TWdiff}) \cdot I_{TWdiff} \tag{52}$$

The result of diag(A) is a square diagonal matrix which contains the elements of column vector A in the diagonal elements. During a fault at an arbitrary location along the transmission line, i.e. $0 < l_B < 1$, neither of the respective, corresponding elements in $I_{TWdiff}$ and $\hat{I}_{TWdiff}$ corresponding to a healthy conductor can be assumed to be zero. Applying the differential current as experienced by the protection in the receiving transmission line end from equation (40) for a fault occurring at an arbitrary distance $0 < l_B < 1$ from the receiving transmission line end:

$$I_{TWdiff} = T_i H_{l_B}^m T_i^{-1} I_F = \tag{53}$$

$$T_i \begin{bmatrix} H_{l_B}'^{m1}(s) \cdot e^{-s\tau_{1B}} & 0 & \cdots & 0 \\ 0 & H_{l_B}'^{m2}(s) \cdot e^{-s\tau_{2B}} & \cdots & 0 \\ \vdots & \vdots & \ddots & \vdots \\ 0 & 0 & \cdots & H_{l_B}'^{mn}(s) \cdot e^{-s\tau_{nB}} \end{bmatrix} T_i^{-1} I_F$$

Using the result in equation (53) and applying the normalization matrix (which is determined for the entire transmission line length l):

$$\hat{I}_{TWdiff} = N_l I_{TWdiff} = T_i N_l^m T_i^{-1} T_i H_{l_B}^m T_i^{-1} I_F = T_i N_l^m H_{l_B}^m T_i^{-1} I_F = \tag{54}$$

$$T_i \begin{bmatrix} N_l'^{m1}(s) \cdot \\ H_{lB}'^{m1}(s) \cdot & 0 & \cdots & 0 \\ e^{-s(\tau_{1B}+\tau_{s_1}-\tau_1)} & & & \\ & N_l'^{m2}(s) \cdot & & \\ 0 & H_{lB}'^{m2}(s) \cdot & \cdots & 0 \\ & e^{-s(\tau_{2B}+\tau_{s_1}-\tau_2)} & & \\ \vdots & \vdots & \ddots & \vdots \\ & & & N_l'^{mn}(s) \cdot \\ 0 & 0 & \cdots & H_{lB}'^{mn}(s) \cdot \\ & & & e^{-s(\tau_{nB}+\tau_{s_1}-\tau_n)} \end{bmatrix}$$

$$T_i^{-1} I_F$$

The two equations (53) and (54) result in two different vectors of differential current during a fault at location $l_B$ before and after the normalization matrix has been applied. As mentioned before, the normalization matrix will when applied introduce filtering and delays in the modes $k \neq s_1$ such that all modes have equal properties during faults located at $l_B=1$. Therefore, during faults at a location of the transmission line $0 < l_B < 1$, the differential current in modes $k \neq s_1$ may be exposed to 'less' delay and filtering than what is assumed in the determination of the normalization matrix, which may result in that $\hat{I}_{TWdiff}$ may appear as 'too much' filtered and/or delayed. Each mode will arrive at the receiving transmission line end in opposite order as compared with the differential current in equation (53), i.e. the mode $s_1$ will arrive at the receiving end first, followed by $s_2$ and so on. Attenuation/distortion will be more evident in the modes which otherwise allow relatively high frequency components to travel down the transmission line.

Figure 6:
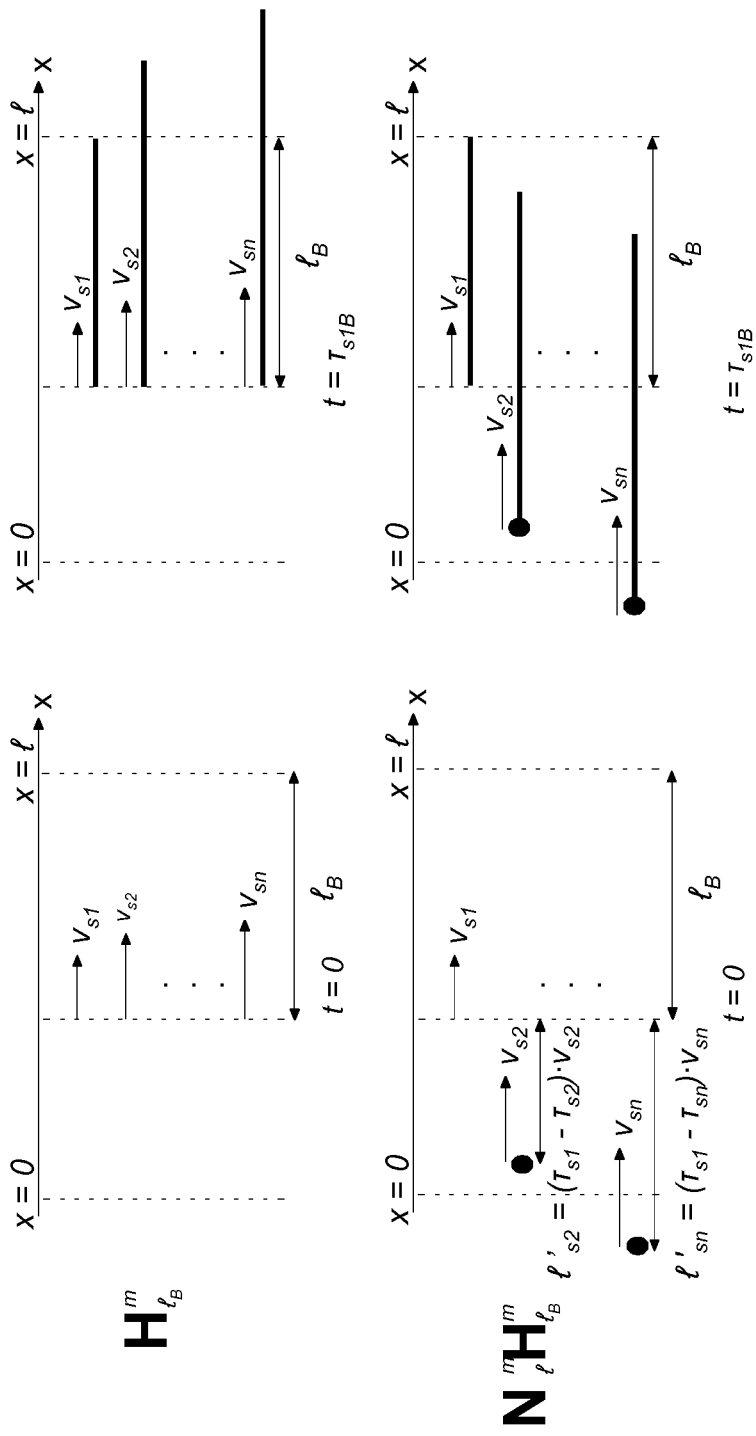
FIG. 6 is a schematic illustration of modal propagation during a fault prior to and after a normalization matrix has been applied to the propagation function according to an example, for illustrating principles of embodiments of the present invention.

FIG. 6 illustrates modal propagation during a fault at a location $l_B$ prior to (the two top graphs) and after (the two bottom diagrams) the normalization matrix has been applied to the propagation function $H^m$. Superscript m denotes modal quantities. The two left-most graphs in FIG. 6 illustrate the instant at which the fault occurs, t=0, and the two right-most graphs in FIG. 6 illustrate arrival of the slowest mode $s_1$ at the receiving transmission line end. FIG. 6 hence illustrates the arrival times before and after $N^m$ has been applied to the propagation function $H^m$. The two graphs at the top of FIG. 6 illustrate modes of the propagation function $H^m$ for distance $l_B$ and the two graphs at the bottom of FIG. 6 illustrate the result after the normalization matrix $N^m$ has been applied to $H^m$. The two left-most graphs illustrate the location of each mode at the moment when the fault occurs, and the two right-most graphs illustrate location of each mode at the time when the slowest mode arrives at the receiving transmission line end, i.e. $t=\tau_{s1B}$. The graph at the top and right illustrates the location of the wave front of the faster modes ($k \neq s_1$) as beyond the transmission line-end at x=1, which is for illustrative purposes to indicate that the modal waves arrived at the transmission line end prior to mode $s_1$. FIG. 6 clearly illustrates the time delay portion of the normalization matrix. In the graph at the bottom and left, the delays introduced in each mode $k \neq s_1$ are illustrated by the dots, which can be interpreted as an extra length of transmission line for each mode to travel, $l'_k$. This extra length of transmission line can be chosen such that all modes arrive at the same time in the worst case, i.e. $l_B=1$. Since the fault according to the example depicted in FIG. 6 occurs at $l_B < 1$, the slowest mode will maintain its 'head start' and thus arrive first at the receiving transmission line end, followed by the second slowest mode $s_2$ and so on, as can be seen in the graph at the bottom and right in FIG. 6. The 'natural' order of arrival of the modes, similarly as for those in $I_{TWdiff}$, is illustrated in the graph at the top and right in FIG. 6, where the arrival of the slowest mode $s_1$ occurs simultaneously with the slowest mode $s_1$ when the normalization matrix $N^m$ has been applied to $H^m$. Since the first mode to arrive after the normalization matrix has been applied is the slowest mode $s_1$, the vector of normalized differential currents $\hat{I}_{TWdiff}$ will include only zero elements up to this time of arrival. This implies that the result of an element-by-element multiplication, $M_{TWdiff}$, also will include zero elements up to that point in time, i.e. $t=\tau_{s1B}$, irrespective of elements in $I_{TWdiff}$ being non-zero.

For the differential currents in $I_{TWdiff}$, when mode $s_1$ arrives, any false differential current will start to decrease towards zero with a rate determined by the time constant associated with $H'^{ms1}_{lB}(s)$. In order to simplify description of principles of embodiments of the present invention, it may be assumed that the fault current in the location of the fault ($I_F$) can be described by a step function, for which the magnitude does not change such that the time delays can be neglected once each mode have arrived. It may further be assumed that the transfer function approaches 1.0 for lower frequencies and that all modes $k \neq s_1$ have relatively high time constants such they have reached their final values when mode $s_1$ arrives at the receiving transmission line end. The differential current for $t \geq \tau_{s1B}$ can then be expressed as:

$$I_{TWdiff}\Big|_{t \geq \tau_{s_1 B}} \approx \left( \sum_{k \neq s_1}^{n} \begin{bmatrix} A_{1k} \\ A_{2k} \\ \vdots \\ A_{nk} \end{bmatrix} [B_{k1} \; B_{k2} \; \cdots \; B_{kn}] + \right. \tag{55}$$

$$\left. H'^{ms_1}_{lB}(s) \begin{bmatrix} A_{1s_1} \\ A_{2s_1} \\ \vdots \\ A_{ns_1} \end{bmatrix} [B_{s_1 1} \; B_{s_1 2} \; \cdots \; B_{s_1 n}] \right) I_F \cdot e^{-s\tau_{s_1 B}}$$

In equation (55) the sum of all column/row products equals the identity matrix, which implies that the sum of all modes except for mode $s_1$ is the identity matrix subtracted by the matrix associated with mode $s_1$:

$$I_{TWdiff}\Big|_{t \geq \tau_{s_1 B}} \approx \left( \begin{bmatrix} 1 & 0 & \cdots & 0 \\ 0 & 1 & \cdots & 0 \\ \vdots & \vdots & \ddots & \vdots \\ 0 & 0 & \cdots & 1 \end{bmatrix} - \begin{bmatrix} A_{1s_1} \\ A_{2s_1} \\ \vdots \\ A_{ns_1} \end{bmatrix} [B_{s_1 1} \; B_{s_1 2} \; \cdots \; B_{s_1 n}] + \right. \tag{56}$$

$$\left. H'^{ms_1}_{lB}(s) \begin{bmatrix} A_{1s_1} \\ A_{2s_1} \\ \vdots \\ A_{ns_1} \end{bmatrix} [B_{s_1 1} \; B_{s_1 2} \; \cdots \; B_{s_1 n}] \right) I_F \cdot e^{-S\tau_{s_1 B}}$$

Expansion of the multiplication in equation (56) yields:

$$I_{TWdiff}|_{t \geq \tau_{s_1 B}} \approx \left( \begin{bmatrix} 1 - A_{1s_1} B_{s_1 1} & -A_{1s_1} B_{s_1 2} & \cdots & -A_{1s_1} B_{s_1 n} \\ -A_{2s_1} B_{s_1 1} & 1 - A_{2s_1} B_{s_1 2} & \cdots & -A_{2s_1} B_{s_1 n} \\ \vdots & \vdots & \ddots & \vdots \\ -A_{ns_1} B_{s_1 1} & -A_{ns_1} B_{s_1 2} & \cdots & 1 - A_{ns_1} B_{s_1 n} \end{bmatrix} + \right. \quad (57)$$

$$\left. H_{l_B}^{\prime ms_1}(s) \begin{bmatrix} A_{1s_1} B_{s_1 1} & A_{1s_1} B_{s_1 2} & \cdots & A_{1s_1} B_{s_1 n} \\ A_{2s_1} B_{s_1 1} & A_{2s_1} B_{s_1 2} & \cdots & A_{2s_1} B_{s_1 n} \\ \vdots & \vdots & \ddots & \vdots \\ A_{ns_1} B_{s_1 1} & A_{ns_1} B_{s_1 2} & \cdots & A_{ns_1} B_{s_1 n} \end{bmatrix} \right) I_F \cdot e^{-s\tau_{s_1 B}}$$

Since the modes will appear in reversed order in the normalized differential current $\hat{I}_{TWdiff}$, the first mode $s_1$ will appear at $t = \tau_{s_1 B}$, i.e. at the same time as for the 'original' differential current. Before $t = \tau_{s_1 B}$, all elements in $\hat{I}_{TWdiff}$ will be zero. In the time interval between the arrival of slowest mode ($t = \tau_{s_1 B}$) and the second (next) slowest mode ($t = \tau_{s_2 B} + \tau_{s_1} - \tau_{s_2}$), $\hat{I}_{TWdiff}$ can be expressed as:

$$\hat{I}_{TWdiff}|_{\tau_{s_1 B} \leq t < \tau_{s_2 B} + \tau_{s_1} - \tau_{s_2}} = \quad (58)$$

$$\left( H_{l_B}^{\prime ms_1}(s) \begin{bmatrix} A_{1s_1} \\ A_{2s_1} \\ \vdots \\ A_{ns_1} \end{bmatrix} \begin{bmatrix} B_{s_1 1} & B_{s_1 2} & \cdots & B_{s_1 n} \end{bmatrix} \right) I_F \cdot e^{-s\tau_{s_1 B}}$$

Expansion of equation (58) yields:

$$\hat{I}_{TWdiff}|_{\tau_{s_1 B} \leq t < \tau_{s_2 B} + \tau_{s_1} - \tau_{s_2}} = \quad (59)$$

$$\left( H_{l_B}^{\prime ms_1}(s) \begin{bmatrix} A_{1s_1} B_{s_1 1} & A_{1s_1} B_{s_1 2} & \cdots & A_{1s_1} B_{s_1 n} \\ A_{2s_1} B_{s_1 1} & A_{2s_1} B_{s_1 2} & \cdots & A_{2s_1} B_{s_1 n} \\ \vdots & \vdots & \ddots & \vdots \\ A_{ns_1} B_{s_1 1} & A_{ns_1} B_{s_1 2} & \cdots & A_{ns_1} B_{s_1 n} \end{bmatrix} \right) I_F \cdot e^{-s\tau_{s_1 B}}$$

Comparing the left-hand side matrix in equation (57) with the matrix in equation (59), it can be noted that all off-diagonal elements are equal but have different signs in the two equations. This implies that any false differential current will appear in $\hat{I}_{TWdiff}$ as well during faults at $0 < l_B < 1$, but that it however will appear with opposite sign as compared to a false differential current appearing in $I_{TWdiff}$. The false differential current appearing in $I_{TWdiff}$ will start to decrease towards zero with the same or substantially the same time constant as the false differential current appearing in $\hat{I}_{TWdiff}$ starts to appear. During this time, all false differential currents will have opposite polarities in $I_{TWdiff}$ and $\hat{I}_{TWdiff}$ respectively. A product of two quantities with opposite polarities will be negative, while a product of two quantities of the same polarity—either positive or negative—will be positive. This allows for a false differential current in $M_{TWdiff}$ to be eliminated by discarding all negative products therein. Limiting the elements in $M_{TWdiff}$ to only those with positive values or those being zero, and calculating the square root of each element yields:

$$C_{TWdiff} = \max(0, M_{TWdiff}) \quad (60)$$

The term within the square root in equation (60) is limited to positive values, ande hence evaluation of the square root does not yield an imaginary result.

Hence, for faults that may occur either at or substantially at $l_B = 0$ or $l_B = 1$, an element-bye-element product of vectors $I_{TWdiff}$ and $\hat{I}_{TWdiff}$ may eliminate any false differential current, since in case of a false differential current appearing in an element in one of the respective vectors the corresponding element in the other one of the respective vectors will be zero or substantially zero. However, for a fault that may occur at an arbitrary point or location along the transmission line, such as for example substantially in the middle of the transmission line, false differential currents for corresponding elements may appear in both of the vectors $I_{TWdiff}$ and $\hat{I}_{TWdiff}$. However, as described above, for faults that may occur at such locations along the transmission line, modal components may arrive in opposite order in $I_{TWdiff}$ as compared to $\hat{I}_{TWdiff}$. The first modal component to appear in $\hat{I}_{TWdiff}$ will in general be the slowest mode, $s_1$. Due to properties of the columns in the transformation matrix $T_i$ and the rows of its inverse $T_i^{-1}$, any false differential currents will initially appear with opposite signs in the two vectors $I_{TWdiff}$ and $\hat{I}_{TWdiff}$. A product of two elements with opposite signs will be negative, which means that if all negative values are discarded after the element-by-element multiplication of $I_{TWdiff}$ and $\hat{I}_{TWdiff}$, or limiting the elements in the resulting vector to those having values greater than or equal to zero, any false differential current may be eliminated for faults that may occur at an arbitrary location along the transmission line, $0 \leq l_B \leq 1$.

Referring now to FIG. 7, there is shown a schematic block diagram of a power system 100 according to an embodiment of the present invention. The power system 100 includes a protected unit 102, which according to the embodiment depicted in FIG. 7 is constituted by a section of a multi-conductor transmission line, e.g. an OHL or a DC cable or a combination thereof. The transmission line 102 includes a plurality of conductors. It is to be understood that the protected unit 102 in general may be included in or be any other part or component of the power system 100, for example a transformer, a generator and/or a transformer station busbar (not shown in FIG. 7). In the following, although the protected unit 102 may be referred to as "transmission line", it is to be understood that this is not intended to limit the present invention to the example where the protected unit 102 is constituted by or includes a transmission line.

In FIG. 7, a transmission line 102 between a first position 103 and a second position 104 is shown. The transmission line 102 may be a portion of a longer transmission line. It is to be understood that the transmission line 102 may be a part or portion of the power system 100, which e.g. may include or be constituted by a power transmission system such as an HVDC power transmission system or an HVDC grid or a DC grid. The transmission line 102 is adapted to convey power from the first position 103 to the second position 104, different from the first position 103, or vice versa, via the plurality of conductors. On a condition that a fault occurs in the transmission line 102 there may be generated at least one travelling wave in the transmission line 102. Any distortion, attenuation and/or delay of the waveform of a wave due to propagation of the wave in the transmission line 102 can be modeled by means of a propagation function.

The power system 100 comprises a processing module 120 configured to determine a first travelling wave current in the first position 103 and a second travelling wave current in the second position 104. For example, the processing module 120 may be configured to receive the first travelling wave current and the second travelling wave current from a travelling wave current sensing module 121 included in the power system 100, which travelling wave current sensing module 121 is configured to determine a first travelling wave current in the first position 103 and a second travelling wave current in the second position 104.

Although FIG. 7 indicates wired connections between the processing module 120 and the travelling wave current sensing module 121 and between the travelling wave current sensing module 121 and the first position 103 and the second position 104, respectively, it is to be understood that the connections may be wired and/or wireless, and one-way or two-way as appropriate, using communication techniques known in the art, for signaling e.g. data and or signals.

The processing module 120 is configured to determine a first travelling wave differential current based on a comparison between the determined first travelling wave current or the second travelling wave current and an estimation of the first travelling wave current or the second travelling wave current, respectively. The processing module 120 is configured to estimate the first travelling wave current or the second travelling wave current by applying the propagation function to the second travelling wave current or to the first travelling wave current, respectively. The first travelling wave differential current has a plurality of modes corresponding to respective ones of the plurality of conductors of the transmission line 102.

The processing module 120 is configured to determine a second travelling wave differential current by means of, based on the propagation function, adjustment of at least one of magnitude and phase of the first travelling wave differential current such that all modes attain equal or increasingly equal modal characteristics.

Figure 8:
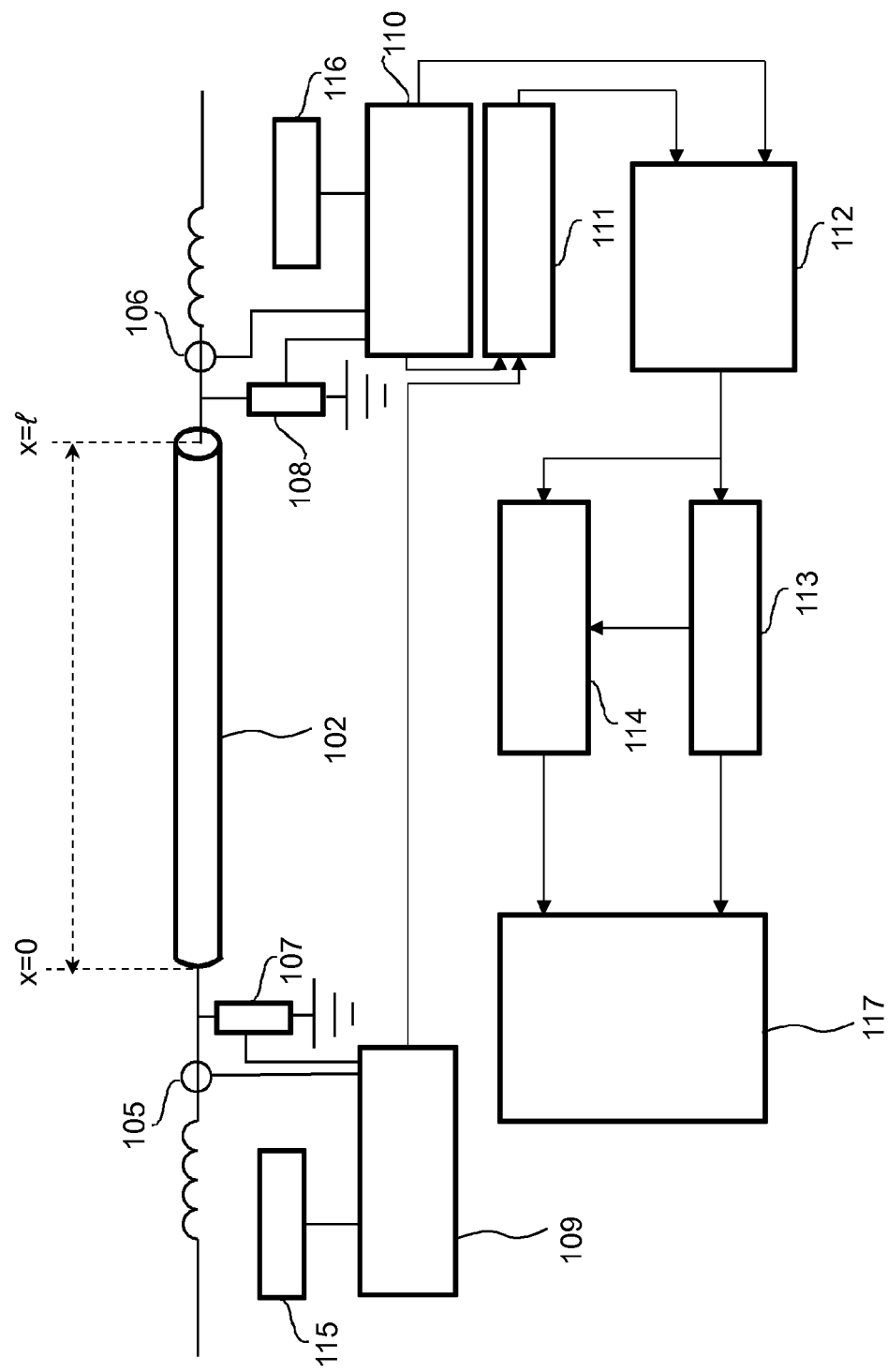
FIG. 8 is a schematic view of a power system according to an embodiment of the present invention.

Referring now to FIG. 8, there is shown a schematic view of a power system 100 according to an embodiment of the present invention. The power system 100 includes a protected unit 102, which according to the embodiment depicted in FIG. 8 is constituted by a section of a multi-conductor transmission line, e.g. an OHL or a DC cable. The transmission line 102 includes a plurality of conductors and has a length l. It is to be understood that the protected unit 102 in general may be included in or be any other part or component of the power system 100, for example a transformer, a generator and/or a transformer station busbar (not shown in FIG. 8). In the following, although the protected unit 102 may be referred to as "transmission line", it is to be understood that this is not intended to limit the present invention to the example where the protected unit 102 is constituted by or includes a transmission line.

The protected unit 102 is adapted to convey power from a first position 103 in the protected unit 102 or transmission line 102 to a second position 104, different from the first position 103, in the transmission line 102, or vice versa, via the plurality of conductors. According to the example depicted in FIG. 8, the first position 103 and the second position 104 are the transmission line 102 ends at x=0 and x=l, respectively. On a condition that a fault occurs in the transmission line 102 there may be generated at least one travelling wave in the transmission line 102. Any distortion, attenuation and/or delay of the waveform of a wave due to propagation of the wave in the transmission line 102 can be modeled by means of a propagation function.

According to the embodiment illustrated in FIG. 8, the power system 100 comprises two current sensing units 105, 106. The current sensing unit 105 is configured to sense at least one first current in the first position 103, and the current sensing unit 106 is configured to sense at least one second current in the second position 104. According to the embodiment illustrated in FIG. 8, the power system 100 further comprises two voltage sensing units 107, 108. The voltage sensing unit 107 is configured to sense at least one first voltage in the first position 103, e.g. between the first position 103 and ground, and the voltage sensing unit 108 is adapted to sense at least one second voltage in the second position 104, e.g. between the second position 104 and ground. Current and/or voltage may be sensed with respect to individual conductors in the transmission line 102. The current sensing units 105, 106 and the voltage sensing units 107, 108 may include any suitable type or types of current sensors and voltage sensors, respectively, as known in the art, possibly depending on the particular configuration and/or nature of the transmission line 102. Although FIG. 8 depicts an example arrangement where the current sensing units 105, 106 are separate units, and the voltage sensing units 107, 108 are separate units, it is to be understood that this is according to an example and other arrangements are possible, for example a case where the current sensing units 105, 106 are integrally arranged in a single unit and/or the voltage sensing units 107, 108 are integrally arranged in a single unit. According to another example, the current sensing unit 105 and the voltage sensing unit 107, and the current sensing unit 106 and the voltage sensing unit 108, respectively, may be integrally arranged in respective single units.

According to the embodiment illustrated in FIG. 8, the power system 100 comprises a first processing unit 109 and a second processing unit 110. The functionality of the first and second processing units 109, 110, as described in the following, may however be provided for in one unit or entity.

The first processing unit 109 is adapted to determine a first travelling wave current in the first position 103 based on the at least one first current and the at least one first voltage sensed in the first position 103 by the current sensing unit 105 and the voltage sensing unit 107, respectively. The second processing unit 110 is adapted to determine a second travelling wave current in the second position 104 based on the at least one second current and the at least one second voltage sensed in the second position 104 by the current sensing unit 106 and the voltage sensing unit 108, respectively. One or both of the first and second processing units 109, 110 may be adapted to model any distortion, attenuation and/or delay of the waveform of a wave due to propagation of the wave in the transmission line 102 by means of the propagation function.

According to the embodiment illustrated in FIG. 8, the power system 100 comprises a third processing unit 111 to which the first travelling wave current and/or the at least one second travelling wave current as determined by the first processing unit 109 and the second processing unit 110, respectively, are input. The third processing unit 111 is configured to estimate the first travelling wave current and/or the at least one second travelling wave current. The estimation is carried out by the third processing unit 111 being configured to apply the propagation function to the second travelling wave current or to the first travelling wave current, respectively.

According to the embodiment illustrated in FIG. 8, the power system 100 comprises a fourth processing unit 112 to which the first travelling wave current and/or the at least one second travelling wave current as determined by the first processing unit 109 and the second processing unit 110, respectively, are input, and also an estimation of the first travelling wave current or the second travelling wave current, respectively, as determined by the third processing unit 111. The fourth processing unit 112 is configured to determine a first travelling wave differential current based on a comparison between the determined first travelling wave current or the second travelling wave current and the estimation of the first travelling wave current or the second travelling wave current, respectively.

According to the embodiment illustrated in FIG. 8, the power system 100 comprises a fifth processing unit 113 to which the first travelling wave differential current is input. The fifth processing unit 113 is configured to determine a second travelling wave differential current by means of, based on the propagation function, adjustment of at least one of magnitude and phase of the first travelling wave differential current such that all modes attain equal or increasingly equal modal characteristics.

The connections between the different entities in the power system 100 as indicated in FIG. 8 by the solid lines between the different entities may be wired and/or wireless, and one-way or two-way as appropriate, using communication techniques known in the art, for signaling e.g. data and or signals. Although some of the connecting lines drawn in FIG. 8 are one-way arrows, this does not exclude the possibility of there being two-way communication between the respective entities.

In accordance with the embodiment depicted in FIG. 8, the power system 100 may comprise a sixth processing unit 114 to which the first travelling wave differential current, as determined by the fourth processing unit 112, and the second travelling wave differential current, as determined by the fifth processing unit 113, are input. The sixth processing unit 114 is configured to determine a third travelling wave differential current based on a combination of the first travelling wave differential current and the second travelling wave differential current. For example, in case each of the first travelling wave differential current and the second travelling wave differential current comprises a plurality of elements, the third travelling wave differential current may be determined by means of element-by-element multiplication of the first travelling wave differential current and the second travelling wave differential current. Each element in the first travelling wave differential current and the second travelling wave differential current, respectively, may correspond to a respective one of the plurality of conductors.

With further reference to FIG. 7, the processing module 120 depicted in FIG. 7 may according to one example include units similar to or the same as the first to sixth processing units 109-114 depicted in FIG. 8. However, according to other examples the processing module 120 depicted in FIG. 7 may include the functionality of the first to sixth processing units 109-114 depicted in FIG. 8 in a single or in a few units.

With further reference to FIG. 8, the power system 100 may comprise a first clock unit 115 and a second clock unit 116 for measuring or keeping track of time. The first and second clock units 115, 116 may for example comprise Global Positioning System (GPS) based clocks or the like. The first clock unit 115 may be configured to determine a time when the first travelling wave current was determined. The second clock unit 116 may be configured to determine a time when the second travelling wave current was determined. A time-shift function may be determined by the first processing unit 109 and/or the second processing unit 110 based on the determined time(s) and a propagation time period of a wave travelling from the first position 103 to the second position 104, or vice versa. The estimation of the first travelling wave current or the second travelling wave current as described in the foregoing may be carried out by applying the time-shift function to the propagation function so as to obtain a time-shifted propagation function and applying the time-shifted propagation function to the second travelling wave current or to the first travelling wave current, respectively. By means of the time-shifted propagation function, the travelling time of a wave travelling between the first position 103 and the second position 104 may be compensated for.

The power system 100 may comprise a decision logic module 117 to which for example the second travelling wave differential current, as determined by the fifth processing unit 113, and possibly a third travelling wave differential current, as determined by the sixth processing unit 114, are input.

The decision logic module 117 may be configured to assess or compare at least some of the elements of the second travelling wave differential current with respect to a fault sensing criterion, and on a condition that an element complies with the fault sensing criterion, determine that there is a fault in the conductor corresponding to that element.

On a condition that there is determined that there is a fault in a conductor included in the transmission line 102, protective action may be taken. The transmission line 102, or at least the conductor or conductors in which a fault has been determined to occur, may be isolated from at least a portion of the rest of the power system 100, e.g. by means of some circuit breaker arrangement (not shown in FIG. 8).

The decision logic module 117 may be configured to assess or compare at least some of the elements of the third travelling wave differential current with respect to a fault sensing criterion. On a condition that an element complies with the fault sensing criterion, the decision logic module 117 determine and/or declare that there is a fault in the conductor corresponding to that element. The fault sensing criterion may for example include whether an element complies with a predefined fault sensing metric. In alternative or in addition, the fault sensing criterion may for example be based on detection techniques such as time-inverse overcurrent characteristic or differential-restrain or current restraining characteristic, as known in the art.

The decision logic module 117 may together with the processing module 120 depicted in FIG. 7 or the processing module as embodied by the first to sixth processing units 109-114 depicted in FIG. 8 at least in part constitute a fault sensing system adapted to sense a fault in the transmission line 102.

Referring now to FIG. 9, there is shown a schematic view of computer-readable means 122, 123 carrying computer program code according to embodiments of the present invention. The computer-readable means 122, 123 or computer program code is adapted to executed in a processing module according to an embodiment of the present invention, e.g. as described above with reference to FIG. 7 or 8. The computer-readable means 122, 123 or computer program code is configured to, when executed in the processing module, perform a method according to the first aspect as described in the foregoing.

The computer-readable means 122, 123, or computer readable storage mediums, shown in FIG. 9 include a Digital Versatile Disc (DVD) 122 and a floppy disk 123. Although only two different types of computer-readable means 122, 123 are depicted in FIG. 9, the present invention encompasses embodiments employing any other suitable type of computer-readable means or computer-readable digital storage medium, such as, but not limited to, a nonvolatile memory, a hard disk drive, a CD, a Flash memory, magnetic tape, a USB memory device, a Zip drive, etc.

The processing module 120 and/or any one of the first to sixth processing units 109-114 may include or be constituted for example by any suitable CPU, microcontroller, DSP, ASIC, FPGA, etc., or any combination thereof. The processing module 120 and/or any one of the first to sixth processing units 109-114 may optionally be capable of executing software instructions stored in a computer program product e.g. in the form of a memory. The memory may for example be any combination of RAM and ROM. The memory may comprise persistent storage, which for example can be a magnetic memory, an optical memory, a solid state memory or a remotely mounted memory, or any combination thereof.

In conclusion, a method in a power system is disclosed, according to an embodiment of the present invention. The power system includes a protected unit adapted to convey power from a first position in the protected unit to a second position in the protected unit, or vice versa, via a plurality of conductors. A first travelling wave differential current is determined based on a comparison between a determined first travelling wave current or a second travelling wave current in first and second positions and an estimation of the first travelling wave current or the second travelling wave current, respectively. The estimation is carried out using a propagation function which takes into account any distortion, attenuation and/or delay of the waveform of a wave due to propagation of the wave in the protected unit. A second travelling wave differential current is determined by means of, based on the propagation function, adjusting at least one of magnitude and phase of the first travelling wave differential current such that all modes attain equal or increasingly equal modal characteristics. The method may facilitate or enable mitigating or even eliminating any false differential current in elements of a travelling wave differential current vector which correspond to healthy conductors, caused by coupling effects between conductors.

While the present invention has been illustrated and described in detail in the appended drawings and the foregoing description, such illustration and description are to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measures cannot be used to advantage.

The invention claimed is:

1. A method in a power system including a protected unit adapted to convey power from a first position in the protected unit to a second position, different from the first position, in the protected unit, or vice versa, via a plurality of conductors, wherein on a condition that a fault occurs in the protected unit, at least one travelling wave is generated in the protected unit, wherein any distortion, attenuation and/or delay of the waveform of a wave due to propagation of the wave in the protected unit can be modeled by means of a propagation function, the method comprising the steps of:
  determining a first travelling wave current in the first position and a second travelling wave current in the second position; and
  determining a first travelling wave differential current based on a comparison between the determined first travelling wave current or the second travelling wave current and an estimation of the first travelling wave current or the second travelling wave current, respectively,
  wherein the estimation of the first travelling wave current or the second travelling wave current is carried out by applying the propagation function to the second travelling wave current or to the first travelling wave current, respectively, wherein the first travelling wave differential current has a plurality of modes corresponding to respective ones of the plurality of conductors,
  the method further comprising the step of:
  determining a second travelling wave differential current by means of, based on the propagation function, adjusting at least one of magnitude and phase of the first travelling wave differential current such that all modes attain equal or increasingly equal modal characteristics.

2. The method according to claim 1, further comprising step of:
  based on the first travelling wave differential current, identifying a mode of the first travelling wave differential current having a largest propagation delay,
  wherein the adjustment of at least one of magnitude and phase of the first travelling wave differential current such that all modes attain equal or increasingly equal modal characteristics is based on the propagation function for the identified mode.

3. The method according to claim 2, wherein identifying a mode of the first travelling wave differential current mode having a largest propagation delay based on the first travelling wave differential current comprises the step of comparing eigenvalues associated with the modes of the first travelling wave differential current.

4. The method according to claim 1, further comprising the step of adjusting at least one of magnitude and phase of the first travelling wave differential current such that all modes attain equal or increasingly equal arrival times at the first or second position and/or evolvement as a function of time.

5. The method according to claim 1, further comprising the step of:
  determining a third travelling wave differential current based on a combination of the first travelling wave differential current and the second travelling wave differential current.

6. The method according to claim 5, wherein each of the first travelling wave differential current and the second travelling wave differential current comprises a plurality of elements, and wherein the third travelling wave differential current is determined by means of element-by-element multiplication of the first travelling wave differential current and the second travelling wave differential current.

7. The method according to claim 1, further comprising the steps of:
  on a condition that the first travelling wave current is estimated, determining a time when the first travelling wave current was determined;
  on a condition that the second travelling wave current is estimated, determining a time when the second travelling wave current was determined;
  determining a time-shift function based on the determined time and a propagation time period of a wave travelling from the first position to the second position, or vice versa,
  wherein the estimation of the first travelling wave current or the second travelling wave current is carried out by applying the time-shift function to the propagation function so as to obtain a time-shifted propagation function and applying the time-shifted propagation function to the second travelling wave current or to the first travelling wave current, respectively.

8. The method according to claim 1, further comprising the steps of:
sensing at least one first current and at least one first voltage, respectively, in the first position; and
sensing at least one second current and at least one second voltage, respectively, in the second position,
wherein the first travelling wave current is determined based on the at least one first current and the at least one first voltage, and the second travelling wave current is determined based on the at least one second current and the at least one second voltage.

9. The method according to claim 8, wherein:
sensing of the at least one second current and the at least one second voltage, respectively, is performed subsequent to sensing the at least one first current and the at least one first voltage, respectively, or vice versa;
sensing of the at least one first current is performed simultaneously with sensing of the at least one first voltage; and/or
sensing of the at least one second current is performed simultaneously with sensing of the at least one second voltage.

10. The method according to claim 8, further comprising the steps of:
on a condition that the first travelling wave current is estimated, determining a time when the first travelling wave current was determined;
on a condition that the second travelling wave current is estimated, determining a time when the second travelling wave current was determined;
determining a time-shift function based on the determined time and a propagation time period of a wave travelling from the first position to the second position, or vice versa,
wherein the estimation of the first travelling wave current or the second travelling wave current is carried out by applying the time-shift function to the propagation function so as to obtain a time-shifted propagation function and applying the time-shifted propagation function to the second travelling wave current or to the first travelling wave current, respectively, and
wherein the time when the first travelling wave current was determined is based on a time when the at least one first current and the at least one first voltage, respectively, was sensed and the time when the second travelling wave current was determined is based on a time when the at least one second current and the at least one second voltage, respectively, was sensed.

11. The method according to claim 1, wherein the determination of the first travelling wave current and/or the second travelling wave current is based on an estimated surge admittance of the protected unit.

12. A processing module for use in a power system including a protected unit adapted to convey power from a first position in the protected unit to a second position, different from the first position, in the protected unit, or vice versa, via a plurality of conductors, wherein on a condition that a fault occurs in the protected unit at least one travelling wave is generated in the protected unit, wherein any distortion, attenuation and/or delay of the waveform of a wave due to propagation of the wave in the protected unit can be modeled by means of a propagation function, the processing module being configured to:
determine a first travelling wave current in the first position and a second travelling wave current in the second position;
determine a first travelling wave differential current based on a comparison between the determined first travelling wave current or the second travelling wave current and an estimation of the first travelling wave current or the second travelling wave current, respectively;
estimate the first travelling wave current or the second travelling wave current by applying the propagation function to the second travelling wave current or to the first travelling wave current, respectively, wherein the first travelling wave differential current has a plurality of modes corresponding to respective ones of the plurality of conductors; and
determine a second travelling wave differential current by means of, based on the propagation function, adjustment of at least one of magnitude and phase of the first travelling wave differential current such that all modes attain equal or increasingly equal modal characteristics.

13. The processing module according to claim 12, wherein the processing module is configured to receive the first travelling wave current and the second travelling wave current from a travelling wave current sensing module included in the power system configured to determine a first travelling wave current in the first position and a second travelling wave current in the second position, whereby the first travelling wave current and the second travelling wave current are determined by the processing module by receipt of first travelling wave current and the second travelling wave current from the travelling wave current sensing module.

14. The processing module according to claim 12, wherein the processing module is configured to determine a third travelling wave differential current based on a combination of the first travelling wave differential current and the second travelling wave differential current.

15. The processing module according to claim 14, wherein each of the first travelling wave differential current and the second travelling wave differential current comprises a plurality of elements, and wherein the processing module is configured to determine the third travelling wave differential current by means of element-by-element multiplication of the first travelling wave differential current and the second travelling wave differential current.

16. A fault sensing system for a power system including a protected unit adapted to convey power from a first position in the protected unit to a second position, different from the first position, in the protected unit, or vice versa, via a plurality of conductors, wherein on a condition that a fault occurs in the protected unit at least one travelling wave is generated in the protected unit, wherein the fault sensing system is adapted to sense a fault in the protected unit, the fault sensing system comprising:
the processing module according to claim 12,
wherein a second travelling wave differential current as determined by the processing module has a plurality of elements, each element corresponding to a respective one of the plurality of conductors, and
wherein the fault sensing system is configured to compare at least some of the elements of the second travelling wave differential current with respect to a fault sensing criterion, and on a condition that an element complies with the fault sensing criterion, determine that there is a fault in the conductor corresponding to that element.

17. The fault sensing system according to claim 16, wherein the processing module is configured to determine a third travelling wave differential current based on a combination of the first travelling wave differential current and the second travelling wave differential current, and wherein the third travelling wave differential current as determined by the processing module has a plurality of elements, each element corresponding to a respective one of the plurality of conductors, the fault sensing system being configured to assess at least some of the elements of the third travelling wave differential current with respect to a fault sensing criterion, and on a condition that an element complies with the fault sensing criterion, determine that there is a fault in the conductor corresponding to that element.

18. The fault sensing system according to claim 17, wherein the fault sensing system is configured to exclude any element of the third travelling wave differential current which has a negative value in the assessment of at least some of the elements of the third travelling wave differential current.

19. A power system comprising:
a protected unit adapted to convey power from a first position in the protected unit to a second position, different from the first position, in the protected unit, or vice versa, via a plurality of conductors; and
the processing module according to claim 12.

20. The power system according to claim 19, further comprising:
a fault sensing system for a power system including a protected unit adapted to convey power from a first position in the protected unit to a second position, different from the first position, in the protected unit, or vice versa, via a plurality of conductors, wherein on a condition that a fault occurs in the protected unit at least one travelling wave is generated in the protected unit, wherein the fault sensing system is adapted to sense a fault in the protected unit, the fault sensing system comprising said processing module,
wherein a second travelling wave differential current as determined by the processing module has a plurality of elements, each element corresponding to a respective one of the plurality of conductors, and
wherein the fault sensing system is configured to compare at least some of the elements of the second travelling wave differential current with respect to a fault sensing criterion, and on a condition that an element complies with the fault sensing criterion, determine that there is a fault in the conductor corresponding to that element.

21. A non-transitory computer-readable storage medium on which there is stored a computer program product configured to, when executed in the processing module according to claim 12, perform a method in a power system including a protected unit adapted to convey power from a first position in the protected unit to a second position, different from the first position, in the protected unit, or vice versa, via a plurality of conductors, wherein on a condition that a fault occurs in the protected unit, at least one travelling wave is generated in the protected unit, wherein any distortion, attenuation and/or delay of the waveform of a wave due to propagation of the wave in the protected unit can be modeled by means of a propagation function, the method comprising the steps of:

determining a first travelling wave current in the first position and a second travelling wave current in the second position; and determining a first travelling wave differential current based on a comparison between the deter-mined first travelling wave current or the second travelling wave current and an estimation of the first travelling wave current or the second travelling wave current, respectively; respectively, wherein the estimation of the first travelling wave current or the second travelling wave current is carried out by applying the propagation function to the second travelling wave current or to the first travelling wave current, respectively, wherein the first travelling wave differential current has a plurality of modes corresponding to respective ones of the plurality of conductors; conductors, the method further comprising the step of:

determining a second travelling wave differential current by means of, based on the propagation function, adjusting at least one of magnitude and phase of the first travelling wave differential current such that all modes attain equal or increasingly equal modal characteristics.

* * * * *